(12) United States Patent
Kim et al.

(10) Patent No.: US 11,889,720 B2
(45) Date of Patent: Jan. 30, 2024

(54) DISPLAY APPARATUS INCLUDING A GROOVE DISPOSED IN THE MIDDLE AREA WHILE SURROUNDING THE FIRST HOLE IN THE TRANSMISSION AREA

(71) Applicant: Samsung Display Co., Ltd., Yongin-Si (KR)

(72) Inventors: Jaybum Kim, Yongin-si (KR); Myeongho Kim, Yongin-si (KR); Yeonhong Kim, Yongin-si (KR); Kyoungseok Son, Yongin-si (KR); Sunhee Lee, Yongin-si (KR); Seungjun Lee, Yongin-si (KR); Seunghun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 137 days.

(21) Appl. No.: 17/401,368

(22) Filed: Aug. 13, 2021

(65) Prior Publication Data
US 2022/0069021 A1    Mar. 3, 2022

(30) Foreign Application Priority Data

Aug. 31, 2020  (KR) .................. 10-2020-0110597

(51) Int. Cl.
*H01L 29/08* (2006.01)
*H10K 59/121* (2023.01)
(Continued)

(52) U.S. Cl.
CPC ......... *H10K 59/121* (2023.02); *H10K 50/844* (2023.02); *H10K 59/1213* (2023.02);
(Continued)

(58) Field of Classification Search
CPC .. H10K 59/121; H10K 71/00; H10K 59/1213; H10K 59/1201; H10K 50/844;
(Continued)

(56) References Cited

U.S. PATENT DOCUMENTS 10,541,380 B1 * 1/2020 Sung .................... H10K 59/124
10,797,123 B2   10/2020 Cho et al.
(Continued)

FOREIGN PATENT DOCUMENTS

KR   10-2007-0072207 A   7/2007
KR   10-2019-0095624 A   8/2019
(Continued)

*Primary Examiner* — Phuc T Dang
(74) *Attorney, Agent, or Firm* — Innovation Counsel LLP

(57) ABSTRACT

A display apparatus includes a substrate including a transmission area having a first through hole, a display area surrounding the transmission area, and a middle area disposed between the transmission area and the display area, a pixel circuit disposed on the display area, the pixel circuit including a first thin film transistor including a first semiconductor layer having polycrystalline silicon, and a second thin film transistor including a second semiconductor layer including an oxide semiconductor, a display element including a pixel electrode electrically connected to the pixel circuit, an opposite electrode disposed on the pixel electrode, and an intermediate layer disposed between the pixel electrode and the opposite electrode and including an emission layer, and a groove disposed in the middle area while surrounding the first through hole.

12 Claims, 16 Drawing Sheets

(51) Int. Cl.
*H10K 50/844* (2023.01)
*H10K 59/65* (2023.01)
*H10K 71/00* (2023.01)
*H01L 27/12* (2006.01)
*G06F 3/044* (2006.01)
*G09G 3/3233* (2016.01)
*H01L 29/786* (2006.01)
*H01L 29/66* (2006.01)
*H10K 59/12* (2023.01)

(52) U.S. Cl.
CPC ......... *H10K 59/1216* (2023.02); *H10K 59/65* (2023.02); *H10K 71/00* (2023.02); *G06F 3/044* (2013.01); *G09G 3/3233* (2013.01); *G09G 2300/0426* (2013.01); *G09G 2300/0842* (2013.01); *G09G 2360/14* (2013.01); *H01L 27/127* (2013.01); *H01L 27/1225* (2013.01); *H01L 27/1251* (2013.01); *H01L 27/1255* (2013.01); *H01L 29/66757* (2013.01); *H01L 29/66969* (2013.01); *H01L 29/7869* (2013.01); *H01L 29/78675* (2013.01); *H10K 59/1201* (2023.02)

(58) Field of Classification Search
CPC .... G09G 2300/0426; G09G 2300/0842; H01L 27/1225
USPC .......................................................... 257/40
See application file for complete search history.

(56) References Cited

U.S. PATENT DOCUMENTS

| | | | |
|---|---|---|---|
| 2019/0081273 | A1 | 3/2019 | Sung et al. |
| 2019/0245160 | A1 | 8/2019 | Yoon et al. |
| 2019/0355799 | A1 | 11/2019 | Jeong et al. |
| 2019/0355930 | A1* | 11/2019 | Lee ................ H10K 59/121 |
| 2020/0058728 | A1* | 2/2020 | Song ............... H10K 59/131 |
| 2020/0273927 | A1* | 8/2020 | Oh ................. H10K 59/121 |

FOREIGN PATENT DOCUMENTS

| | | |
|---|---|---|
| KR | 10-2019-0108224 A | 9/2019 |
| KR | 10-2019-0132603 A | 11/2019 |
| KR | 10-2083315 B1 | 3/2020 |

* cited by examiner

DISPLAY APPARATUS INCLUDING A GROOVE DISPOSED IN THE MIDDLE AREA WHILE SURROUNDING THE FIRST HOLE IN THE TRANSMISSION AREA

CROSS-REFERENCE TO RELATED APPLICATIONS

This application is based on and claims priority under 35 U.S.C. § 119 to Korean Patent Application No. 10-2020-0110597, filed on Aug. 31, 2020, in the Korean Intellectual Property Office, the disclosure of which is incorporated by reference herein in its entirety.

BACKGROUND

1. Field

One or more embodiments relate to a display apparatus and a method of manufacturing the display apparatus, and more particularly, to a display apparatus having a transmission area manufactured through simple manufacturing processes and a method of manufacturing the display apparatus.

2. Description of Related Art

Display apparatuses have been used for various purposes. Also, because the thickness and weight of the display apparatuses have been reduced, the utilization of the display apparatuses has increased. Among display apparatuses, organic light-emitting display apparatuses have been highlighted as next-generation display apparatuses due to their wide viewing angles, high contrast, and fast response speeds.

In a display apparatus, various functions have been added to a display apparatus while increasing a display area. As a method of adding various functions while increasing an area, research into a display apparatus having an area for providing other various functions in a display area has been continuously conducted.

SUMMARY

One or more embodiments include a display apparatus having a transmission area manufactured through simple processes while reducing defects during manufacturing or using the display apparatus, and a method of manufacturing the display apparatus. However, the above technical features are exemplary, and the scope of the disclosure is not limited thereto.

Additional aspects will be set forth in part in the description which follows and, in part, will be apparent from the description, or may be learned by practice of the presented embodiments of the disclosure.

According to one or more embodiments, a display apparatus includes a substrate including a transmission area having a first through hole, a display area surrounding the transmission area, and a middle area disposed between the transmission area and the display area, a pixel circuit disposed on the display area, the pixel circuit including a first thin film transistor including a first semiconductor layer having polycrystalline silicon, and a second thin film transistor including a second semiconductor layer including an oxide semiconductor, a display element including a pixel electrode electrically connected to the pixel circuit, an opposite electrode disposed on the pixel electrode, and an intermediate layer disposed between the pixel electrode and the opposite electrode and including an emission layer, and a groove disposed in the middle area while surrounding the first through hole, wherein the groove includes a first hole or a first recess disposed in a base layer of the substrate, a second hole disposed in at least one inorganic insulating layer on the substrate and overlapping the first hole or the first recess in a plan view, a pair of tips obtained by extending the at least one inorganic insulating layer toward a center of the second hole, and a pair of pattern layers overlapping the pair of tips and including a material that is same as a material included in the first semiconductor layer or the second semiconductor layer.

The first semiconductor layer and the second semiconductor layer may be disposed on different layers from each other.

The pair of pattern layers include a material that is same as a material in the second semiconductor layer and the at least one inorganic insulating layer may include a first gate insulating layer and a second gate insulating layer disposed between the first semiconductor layer and the second semiconductor layer.

The pair of pattern layers include a material that is same as a material in the first semiconductor layer and the at least one inorganic insulating layer may include a layer that is in contact with a lower surface of the first semiconductor layer.

The opposite electrode may be disconnected by the pair of tips.

The intermediate layer may be disconnected by the pair of tips.

The intermediate layer may further include a first functional layer disposed between the pixel electrode and the emission layer and a second functional layer disposed between the emission layer and the opposite electrode, the first functional layer may include at least one of a hole transport layer and a hole injection layer, and the second functional layer may include at least one of an electron transport layer and an electron injection layer.

The display apparatus may further include a thin film encapsulation layer covering the display element and including a first inorganic encapsulation layer, an organic encapsulation layer, and a second inorganic encapsulation layer.

The thin film encapsulation layer may continuously cover an internal surface of the second hole, an internal surface of the first hole or the first recess, and a bottom surface of the first hole or the first recess.

The pixel circuit may further include a storage capacitor, and the storage capacitor may include a lower electrode that is integrally provided with a first gate electrode of the first thin film transistor and an upper electrode overlapping the lower electrode.

The upper electrode may include a material that is the same as a material included in the second semiconductor layer.

The upper electrode may have a layered structure that is the same as a layered structure of the second semiconductor layer.

According to one or more embodiments, a method of manufacturing a display apparatus includes forming a first semiconductor layer on a substrate, the first semiconductor layer including polycrystalline silicon and at least one inorganic insulating layer, forming a second semiconductor layer including an oxide semiconductor and a pair of pattern layers on an uppermost layer of the at least one inorganic insulating layer, the pair of pattern layers including a material that is the same as a material in the second semiconductor layer, forming a second hole in the at least one inorganic insulating layer, and a pair of tips by extending the_ at least one inorganic insulating layer using the pair of pattern layers as a mask, forming a first hole or a first recess in a base layer of the substrate, the first hole or the first recess overlapping the second hole in a plan view, and forming a display element including a pixel electrode, an opposite electrode, and an intermediate layer provided between the pixel electrode and the opposite electrode and including an emission layer.

The first semiconductor layer and the second semiconductor layer may be disposed on different layers from each other.

The at least one inorganic insulating layer may include a first gate insulating layer and a second gate insulating layer disposed between the first semiconductor layer and the second semiconductor layer.

The opposite electrode may be disconnected by the pair of tips.

The intermediate layer may be disconnected by the pair of tips.

The intermediate layer may further include a first functional layer disposed between the pixel electrode and the emission layer and a second functional layer disposed between the emission layer and the opposite electrode, the first functional layer may include at least one of a hole transport layer and a hole injection layer, and the second functional layer may include at least one of an electron transport layer and an electron injection layer.

The method may further include forming a thin film encapsulation layer so as to continuously cover an internal surface of the second hole, an internal surface of the first hole or the first recess, and a bottom surface of the first hole or the first recess, wherein the thin film encapsulation layer covers the display element and includes an inorganic encapsulation layer, an organic encapsulation layer, and a second inorganic encapsulation layer.

The forming of the second semiconductor layer may further include forming an upper electrode of a storage capacitor, and the upper electrode may include a material that is same as a material included in the second semiconductor layer.

Other aspects, features and advantages of the disclosure will become better understood through the accompanying drawings, the claims and the detailed description.

Such general and specific aspects of the disclosure may be performed using systems, methods, computer-readable storage mediums, and/or combinations thereof.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
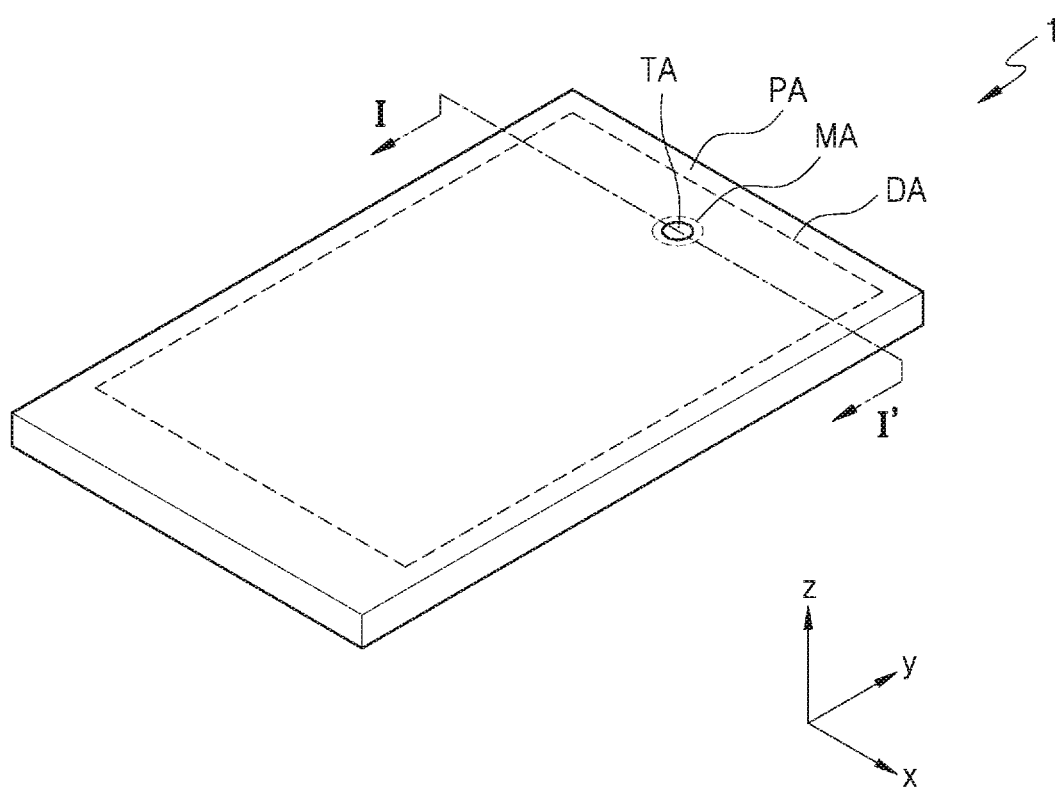
FIG. 1 is a perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, particular embodiments will be illustrated in the drawings and described in detail in the written description. The attached drawings for illustrating one or more embodiments are referred to in order to gain a sufficient understanding, the merits thereof, and the objectives accomplished by the implementation. However, the embodiments may have different forms and should not be construed as being limited to the descriptions set forth herein.

The embodiments will be described below in more detail with reference to the accompanying drawings. Those components that are the same or are in correspondence are rendered the same reference numeral regardless of the figure number, and redundant explanations are omitted.

While such terms as "first," "second," etc., may be used to describe various components, such components are not be limited to the above terms. The above terms are used only to distinguish one component from another.

An expression used in the singular encompasses the expression of the plural unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on" another layer, region, or component, it may be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the specification, the phrase "A and/or B" denotes A, B, or A and B. In addition, the phrase "at least one of A and B" denotes A, B, or A and B.

In the embodiments below, when layers, areas, or elements or the like are referred to as being "connected," it will be understood that they may be directly connected or an intervening portion may be present between layers, areas or elements. For example, when layers, areas, or elements or the like are referred to as being "electrically connected," they may be directly electrically connected, or layers, areas or elements may be indirectly electrically connected and an intervening portion may be present.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Hereinafter, one or more embodiments will be described in detail with reference to accompanying drawings.

FIG. 1 is a perspective view of a display apparatus 1 according to an embodiment.

As shown in FIG. 1, the display apparatus 1 according to the embodiment may include a display area DA and a peripheral area PA surrounding the display area DA. A transmission area TA and a middle area MA surrounding the transmission area TA may be disposed inside of the display area DA.

A plurality of pixels may be disposed in the display area DA. The display area DA may display image via the plurality of pixels. The display area DA corresponds to an active area displaying images. The display area DA may entirely surround the transmission area TA and the middle area MA.

Components that may implement various functions to the display apparatus 1 may be disposed in the transmission area TA. For example, when the component includes a sensor, a camera, etc. that uses light, the light emitted from or proceeding to the sensor or the light proceeding towards the camera may pass through the transmission area TA.

The middle area MA is disposed between the transmission area TA and the display area DA and may surround the transmission area TA. The middle area MA may be a kind of non-display area in which pixels are not disposed. Lines configured to provide a predetermined signal or a voltage to pixels adjacent to the transmission area TA may be disposed in the middle area MA. A groove that will be described later may be in the middle area MA.

The peripheral area PA may be a kind of non-display area in which pixels are not disposed like the middle area MA. Various kinds of lines, circuits, etc. may be disposed in the peripheral area PA.

Each of the pixels in the display apparatus 1 may include a light-emitting diode as a display element emitting light of a predetermined color. The light-emitting diode may include an organic light-emitting diode including an organic material as an emission layer. Alternatively, the light-emitting diode may include an inorganic light-emitting diode. Alternatively, the light-emitting diode may include quantum dots as an emission layer. Hereinafter, a case in which the light-emitting diode includes an organic light-emitting diode will be described for convenience of description, but one or more embodiments are not limited thereto.

FIG. 1 shows that the transmission area TA is disposed at a middle of the display area DA in a width direction (e.g., ±X direction) of the display apparatus 1, but one or more embodiments are not limited thereto. In another embodiment, the transmission area TA may be disposed on a left side or a right side along the width direction of the display apparatus 1. Alternatively, the transmission area TA may be disposed at various locations, e.g., an upper side, an intermediate side, or a lower side in a lengthwise direction (e.g., ±Y direction) of the display apparatus 1.

FIG. 1 shows the display apparatus 1 includes one transmission area TA, but in another embodiment, the display apparatus 1 may include a plurality of transmission areas TA.

Figure 2:
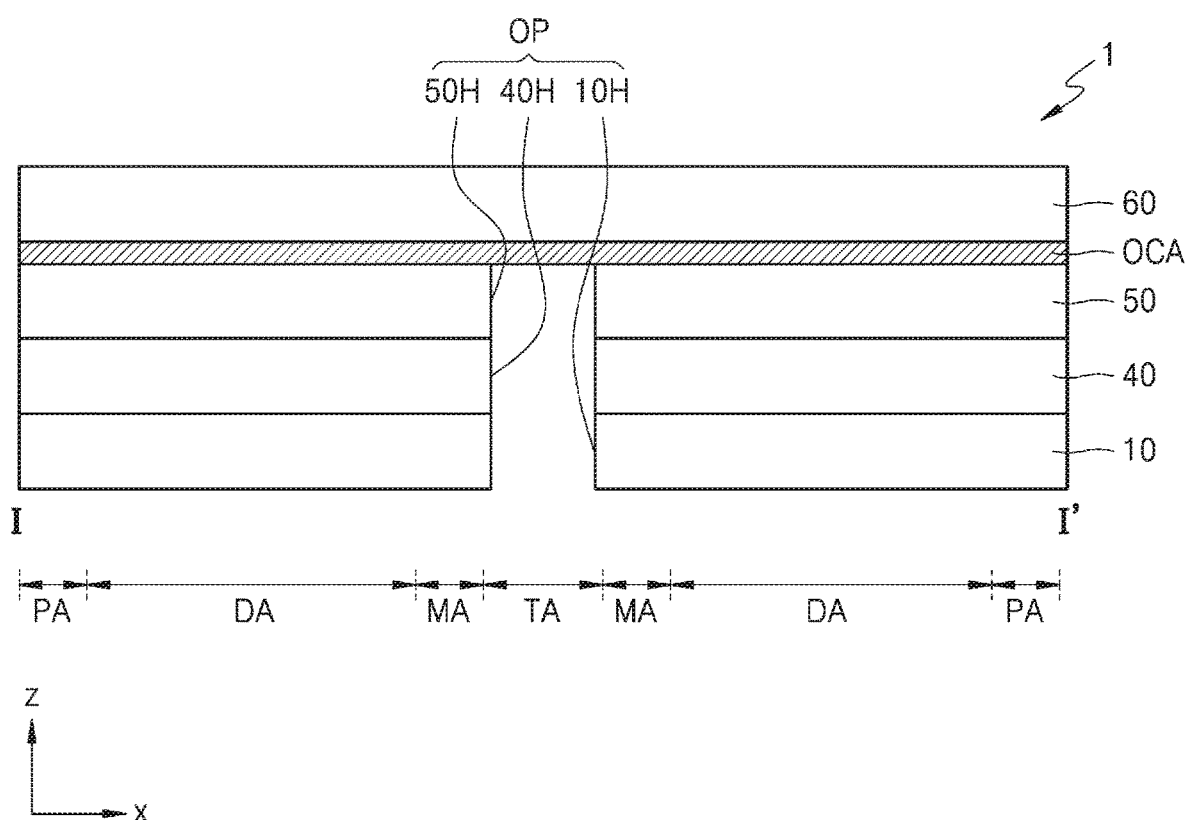
FIG. 2 is a cross-sectional view of a display apparatus according to an embodiment.
Figure 3:
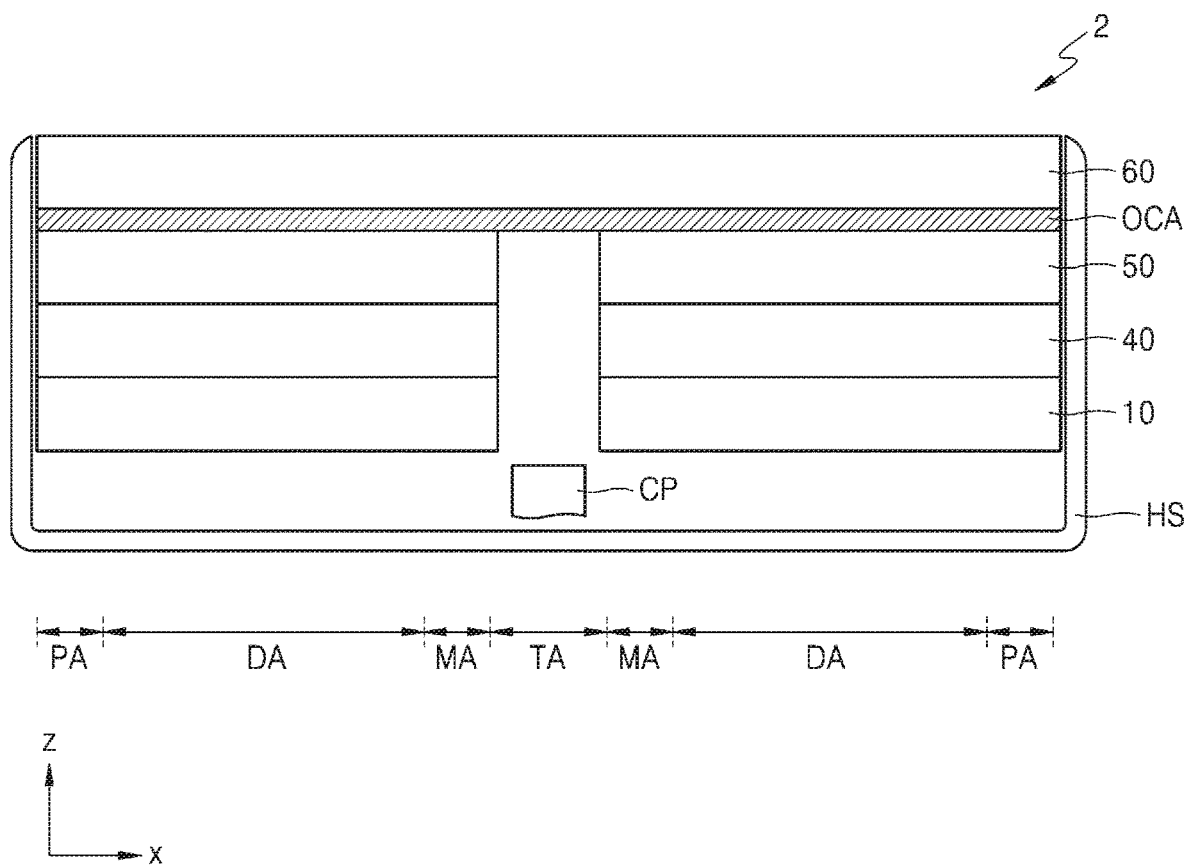
FIG. 3 is a cross-sectional view of an electronic device including a display device according to an embodiment.

FIG. 2 is a cross-sectional view of the display apparatus 1 according to the embodiment, taken along line I-I' of FIG. 1, and FIG. 3 is a cross-sectional view of an electronic device including the display apparatus 1 according to the embodiment.

As shown in FIG. 2, the display apparatus 1 according to the embodiment may include a display panel 10, an input sensor 40 disposed on an upper surface of the display panel 10, and an optical functional layer 50. A window 60 may be bonded to an element thereunder, e.g., the optical functional layer 50, via an optical clear adhesive (OCA).

The display panel 10 may include a plurality of light-emitting diodes in the display area DA. The display panel 10 may include lines for providing signals or voltages to each of the plurality of light-emitting diodes (e.g., a data line, a scan line, a driving voltage line, a common voltage line, etc.) and transistors connected respectively to the plurality of light-emitting diodes.

The input sensor 40 may obtain coordinate information according to an external input, e.g., a touch event. The input sensor 40 may include a touch electrode and trace lines connected to the touch electrode. The input sensor 40 may be disposed on the display panel 10. The input sensor 40 may sense an external input by a mutual capacitance method or a self-capacitance method.

The input sensor 40 may be directly disposed on the display panel 10. Alternatively, the input sensor 40 may be separately manufactured and coupled to the display panel 10 via an adhesive layer such as an OCA. In an embodiment, as shown in FIG. 2, the input sensor 40 may be directly formed on the display panel 10, and in this case, the adhesive layer may not be disposed between the input sensor 40 and the display panel 10.

The optical functional layer 50 may include an anti-reflection layer. The anti-reflection layer may reduce a reflectivity of light incident to the display panel 10 from outside (external light) via the window 60. The anti-reflection layer may include a retarder and a polarizer. The retarder may be of a film type or a liquid crystal coating type and may include a λ/2 retarder and/or a λ/4 retarder. The polarizer may be of a film type or a liquid crystal coating type. The film-type polarizer may include a stretched synthetic resin film, and the liquid crystal coating-type polarizer may include liquid crystals arranged in a certain orientation. The retarder and the polarizer may further include a protective film.

In another embodiment, the anti-reflection layer may include a black matrix and color filters. The color filters may be arranged considering a color of light emitted from each of the pixels in the display panel 10. In another embodiment, the anti-reflection layer may include a destructive interference structure. The destructive interference structure may include a first reflective layer and a second reflective layer disposed on the first reflective layer. First reflected light and second reflected light that are respectively reflected by the first reflective layer and the second reflective layer may destructively interfere with each other, and accordingly, a reflectivity of external light may be reduced.

The optical functional layer 50 may include a lens layer. The lens layer may improve the light-emitting efficiency of light emitted from the display panel 10 or may reduce a color difference. The lens layer may include a layer having a concave or a convex lens shape and/or may include a plurality of layers having different refractive indices. The optical functional layer 50 may include both the anti-reflection layer and the lens layer or may include either the anti-reflection layer or the lens layer.

Referring to FIG. 3, the display apparatus 1 may be included in an electronic device 2 of various types, e.g., a mobile phone, a tablet PC, a laptop computer, a smart watch, etc. The electronic device 2 includes a housing HS having an internal space, and the display panel 10 may be disposed in the housing HS. The window 60 may be coupled to the housing HS. The input sensor 40 and the optical functional layer 50 are disposed on the upper surface of the display panel 10 as described above.

A component CP is disposed in the housing HS and may be disposed between the display panel 10 and an inner bottom surface of the housing HS. The component CP may be disposed in the transmission area TA. The transmission area TA may be referred to as a component area in which the component CP is located.

The component CP may include an electronic element. For example, the component CP may be an electronic element using light. For example, the electronic element may include a light-receiving sensor such as an infrared-ray sensor, a camera capturing an image by receiving light, a sensor for outputting and sensing light to measure a distance or recognize a fingerprint, a small-sized lamp illuminating light, etc.

The electronic element using light may use light of various wavelength bands such as visible light, infrared rays, ultraviolet rays, etc. When the component CP includes a camera, a transmittance of the display apparatus 1 in the transmission area TA may be about 70% or greater. Alternatively, when the component CP includes a sensor, the transmittance of the display apparatus 1 in the transmission area TA may be less than 70%, e.g., about 50% or greater, or 60% or greater.

In order to prevent the transmittance from degrading, the display apparatus 1 (see FIG. 2) may include an opening OP in which elements disposed on a proceeding path of light is removed. The opening OP may be formed by partially removing at least one of the elements included in the display apparatus 1, e.g., the display panel 10, the input sensor 40, the optical functional layer 50, and the window 60. In an embodiment, FIG. 2 shows that the display panel 10, the input sensor 40, and the optical functional layer 50 respectively include first to third through holes 10H, 40H, and 50H that constitute the opening OP.

Referring to FIG. 2, the display panel 10 includes the first through hole 10H penetrating through an upper surface and a bottom surface of the display panel 10, the input sensor 40 includes the second through hole 40H penetrating through an upper surface and a bottom surface of the input sensor 40, and the optical functional layer 50 includes the third through hole 50H penetrating through an upper surface and a bottom surface of the optical functional layer 50. The first to third through holes 10H, 40H, and 50H are in the transmission area TA and may overlap one another.

Figure 4:
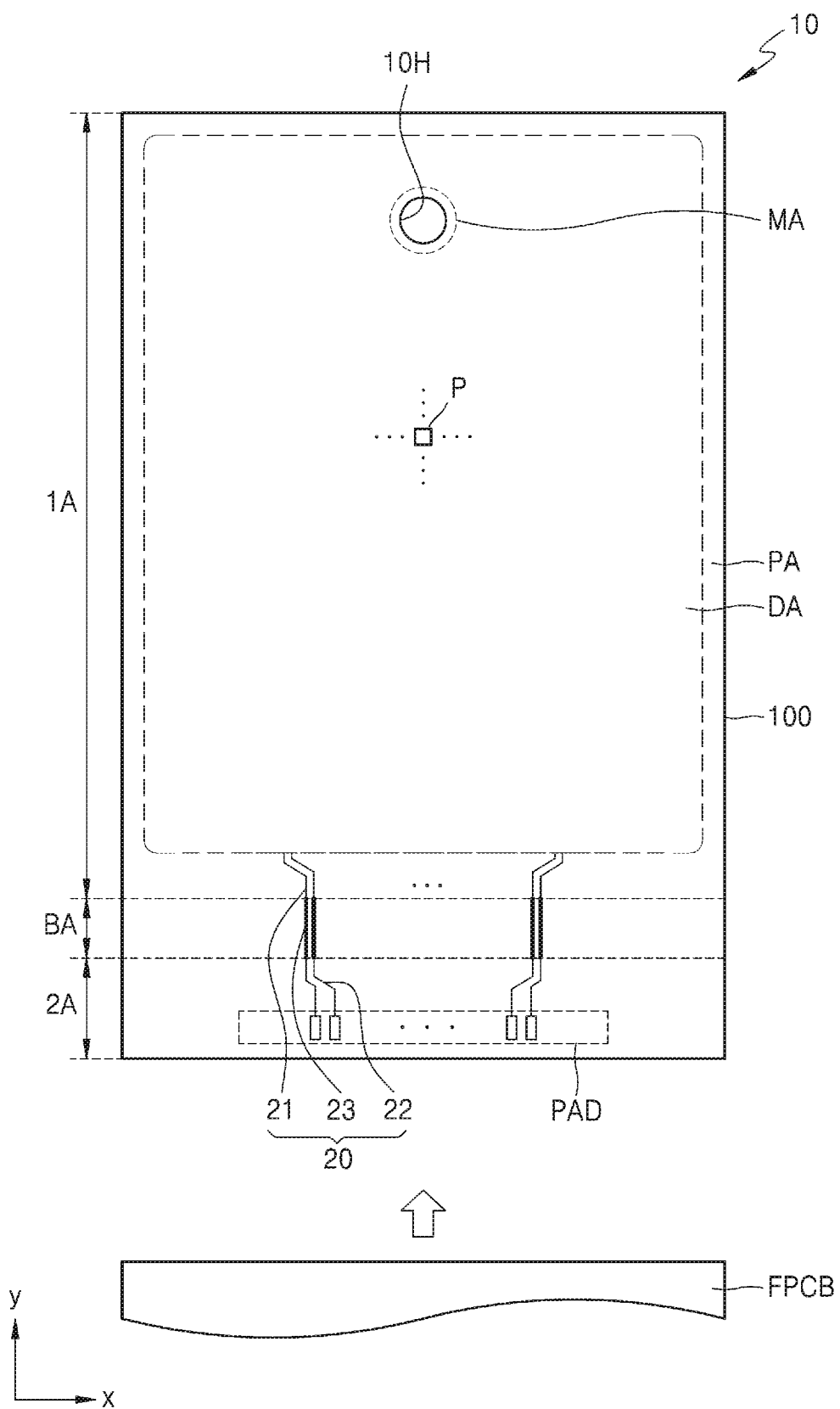
FIG. 4 is a plan view of a display panel included in a display apparatus according to an embodiment.
Figure 5:
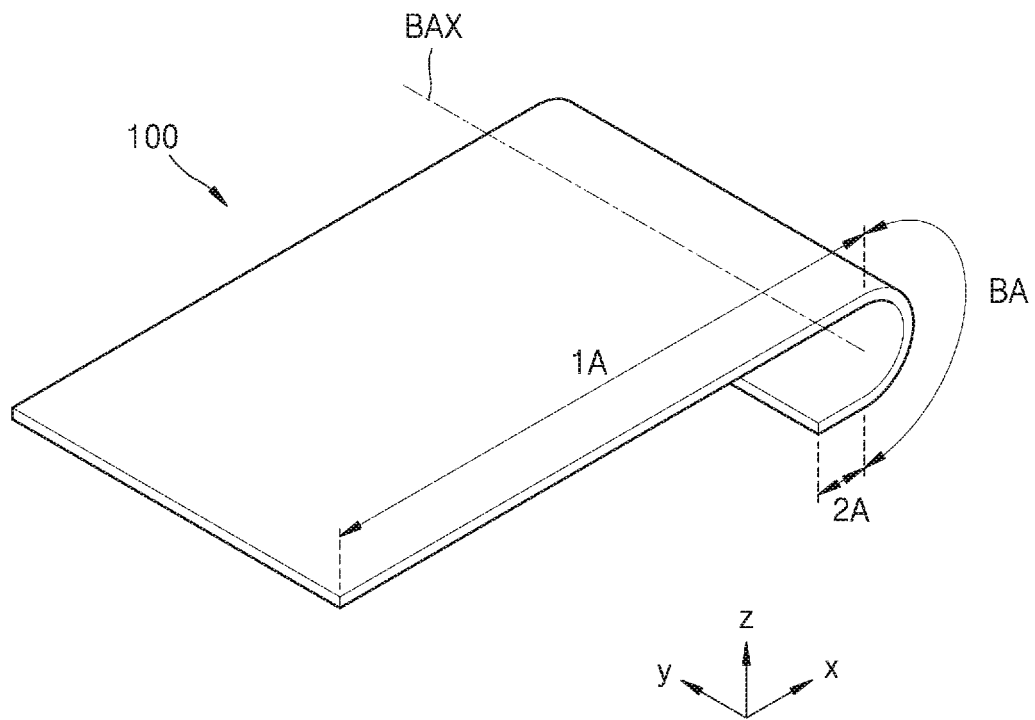
FIG. 5 is a perspective view showing a substrate in a display panel according to an embodiment.

FIG. 4 is a plan view of the display panel 10 included in the display apparatus 1 according to an embodiment, and FIG. 5 is a perspective view of a substrate in the display panel 10 according to the embodiment.

As shown in FIG. 4, the display panel 10 includes pixels P disposed on the substrate 100. The pixels P are disposed in the display area DA to provide images. Each of the pixels P may include a display element, e.g., a light-emitting diode that may emit light of a predetermined color.

The first through hole 10H may be formed in an area corresponding to the transparent area TA. Because the first through hole 10H is formed in the area corresponding to the transparent area TA which is surrounded by the display area, the pixels P may be disposed to surround the first through hole 10H. The pixels P may be disposed at opposite sides of the first through hole 10H in a cross sectional view. For example, the first through hole 10H may be disposed between two neighboring pixels P with the first through hole interposed therebetween in the cross sectional view.

The middle area MA may have a certain area surrounding the first through hole 10H. Lines (e.g., a data line, a scan line, a driving voltage line, etc.) configured to apply signals or voltages to the pixels around the first through hole 10H may be disposed in the middle area MA. The middle area MA may include a groove for preventing moisture permeation into the display area as will be described later.

The peripheral area PA may surround the display area DA. A scan driver, a data driver, etc. may be disposed in the peripheral area PA. Pads PAD may be disposed in the peripheral area PA. The pads PAD may be disposed adjacent to one edge of the substrate 100. The pads PAD are not covered by an insulating layer, but is exposed and electrically connected to a flexible printed circuit board FPCB. The flexible printed circuit board FPCB electrically connects a controller to the pads PAD and may supply to the pads PAD signals or electric powers transferred from the controller. In some embodiments, a data driver may be disposed in the flexible printed circuit board FPCB. In order to transfer a signal or a voltage in the flexible printed circuit board FPCB to the pixels P, the pads PAD may be connected to a plurality of lines 20.

In an embodiment, the peripheral area PA may include a bending area BA. The bending area BA may be disposed between the pads PAD and the display area DA. The bending area BA may extend in a direction intersecting with a direction in which the lines 20 extend. The bending area BA may extend in a direction in parallel with one edge of the substrate 100. The substrate 100 may include a first area 1A including the display area DA and a second area 2A opposite to the first area 1A with respect to the bending area BA. The bending area BA is disposed between the first area 1A and the second area 2A. The first area 1A includes the display area DA and part of the peripheral area PA, and the second area 2A may only include part of the peripheral area PA.

The display panel 10 may be bent about the bending area BA. In this regard, FIG. 5 shows that the substrate 100 of the display panel 10 is bent. The substrate 100 is bent about a bending axis BAX that extends in a Y-direction, and thus, the display panel 10 may also be bent like the substrate 100. The substrate 100 may include various materials (e.g., a polymer resin) that are flexible or bendable. FIG. 5 shows that the substrate 100, not the display panel 10, is bent, but layers on the substrate 100 may be also bent with the substrate 100.

As shown in FIG. 4, each of the lines 20 may include a first portion 21 and a second portion 22 which are disposed at opposite sides of the bending area BA, and a third portion 23 connecting the first portion 21 to the second portion 22. The first portion 21 is between the display area DA and the bending area BA, the second portion 22 may be disposed between the bending area BA and the pad PAD, and the third portion 23 may be disposed in the bending area BA.

When the substrate 100 is bent about the bending area BA, the lines 20 may be disconnected or layers on and under the lines 20 may be peeled. To prevent this, as described above, the line 20 includes the first portion 21 and the second portion 22 that are spaced apart from each other with the bending area BA disposed therebetween, and the first portion 21 and the second portion 22 may be connected to each other via the third portion 23 including a material having relatively high flexibility.

Figure 6:
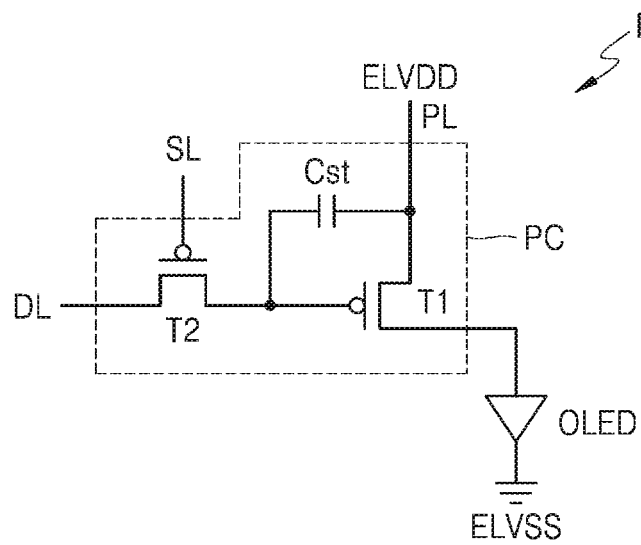
FIG. 6 is an equivalent circuit diagram showing one pixel included in a display panel according to an embodiment.

FIG. 6 is an equivalent circuit diagram showing one pixel included in the display panel 10 according to an embodiment.

Referring to FIG. 6, the light-emitting diode, e.g., an organic light-emitting diode OLED, may be connected to a pixel circuit PC. The pixel circuit PC may include a driving thin film transistor T1, a switching thin film transistor T2, and a storage capacitor Cst. Each of the pixels P may emit light, e.g., one of red light, green light, blue light, and white light, from the organic light-emitting diode OLED.

A gate of the switching thin film transistor T2 is connected to a scan line SL and a source electrode of the switching thin film transistor T2 is connected to a data line DL. The switching thin film transistor T2 may be configured to transfer a data voltage input from the data line DL to the driving thin film transistor T1 in response to a switching voltage input from the scan line SL. The storage capacitor Cst is connected between a gate electrode of the switching thin film transistor T2 and a driving voltage line PL, and may store a voltage corresponding to a difference between a voltage transferred from the switching thin film transistor T2 and a first power voltage ELVDD supplied to the driving voltage line PL.

The driving thin film transistor T1 is connected between the driving voltage line PL and the organic light-emitting diode OLED. The driving thin film transistor T1 may control a driving current flowing in the organic light-emitting diode OLED from the driving voltage line PL corresponding to the voltage stored in the storage capacitor Cst. The organic light-emitting diode OLED may emit light having a certain luminance according to the driving current. An opposite electrode (e.g., a cathode) of the organic light-emitting diode OLED may receive a second power voltage ELVSS.

FIG. 6 illustrates that the pixel circuit PC includes two thin film transistors and one storage capacitor, but one or more embodiments are not limited thereto. The number of thin film transistors and the number of storage capacitors may vary depending on a design of the pixel circuit PC. For example, the pixel circuit PC may include four or more thin film transistors in addition to the two thin film transistors described above.

Figure 7:
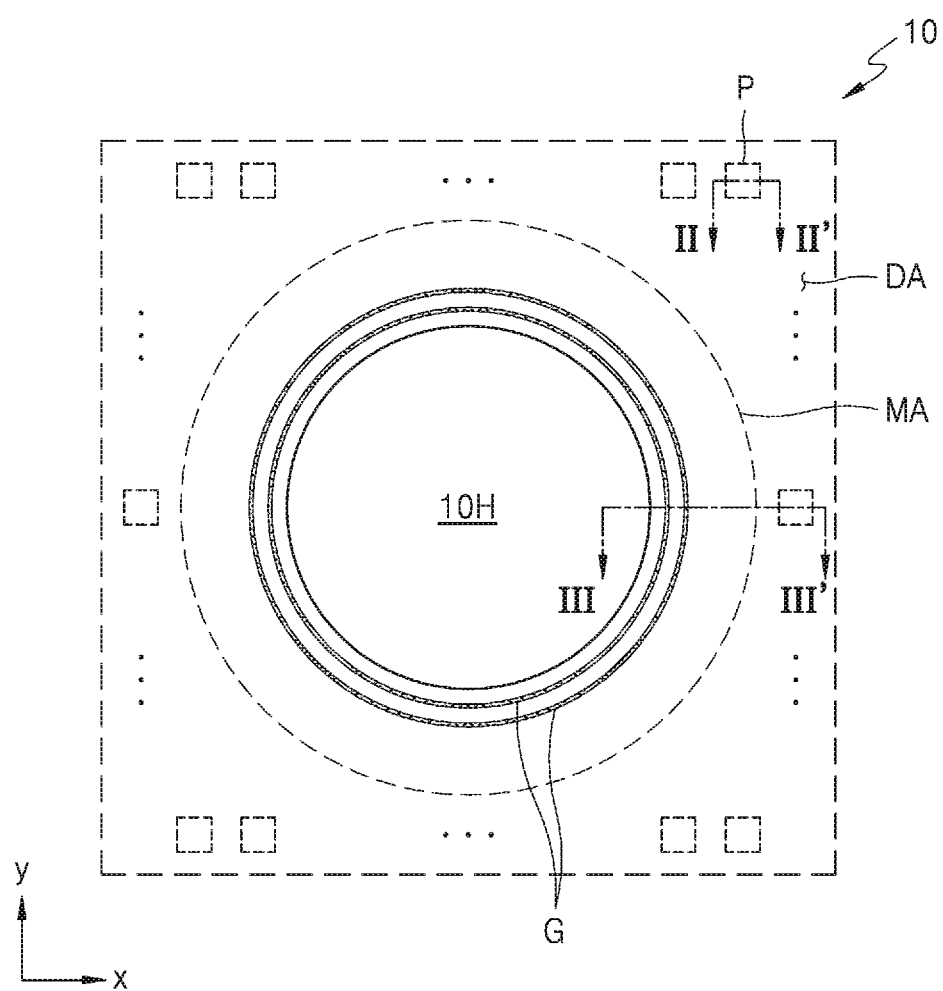
FIG. 7 is a plan view showing a portion of a display panel according to an embodiment.

FIG. 7 is a plan view showing a portion of the display panel 10 according to an embodiment.

As shown in FIG. 7, the pixels P are disposed in the display area DA, and the first through hole 10H may be defined between neighboring pixels P in a cross-sectional view. For example, in a plan view, the pixels P are disposed to surround the through hole 10H.

One or more grooves G may be disposed in the middle area MA in order to prevent the permeation of moisture through the first through hole 10H and damage to the light-emitting diode in the pixel P. The grooves G may be disposed in the middle area MA to surround the first through hole 10H as a concentric circle. FIG. 7 shows two grooves G. However, the number of grooves G in the middle area MA is not limited to two, one groove may be provided in the middle area MA. Three or more grooves G may be provided in the middle area MA. When a plurality of grooves G are provided, the grooves G may be spaced apart from one another.

Figure 8:
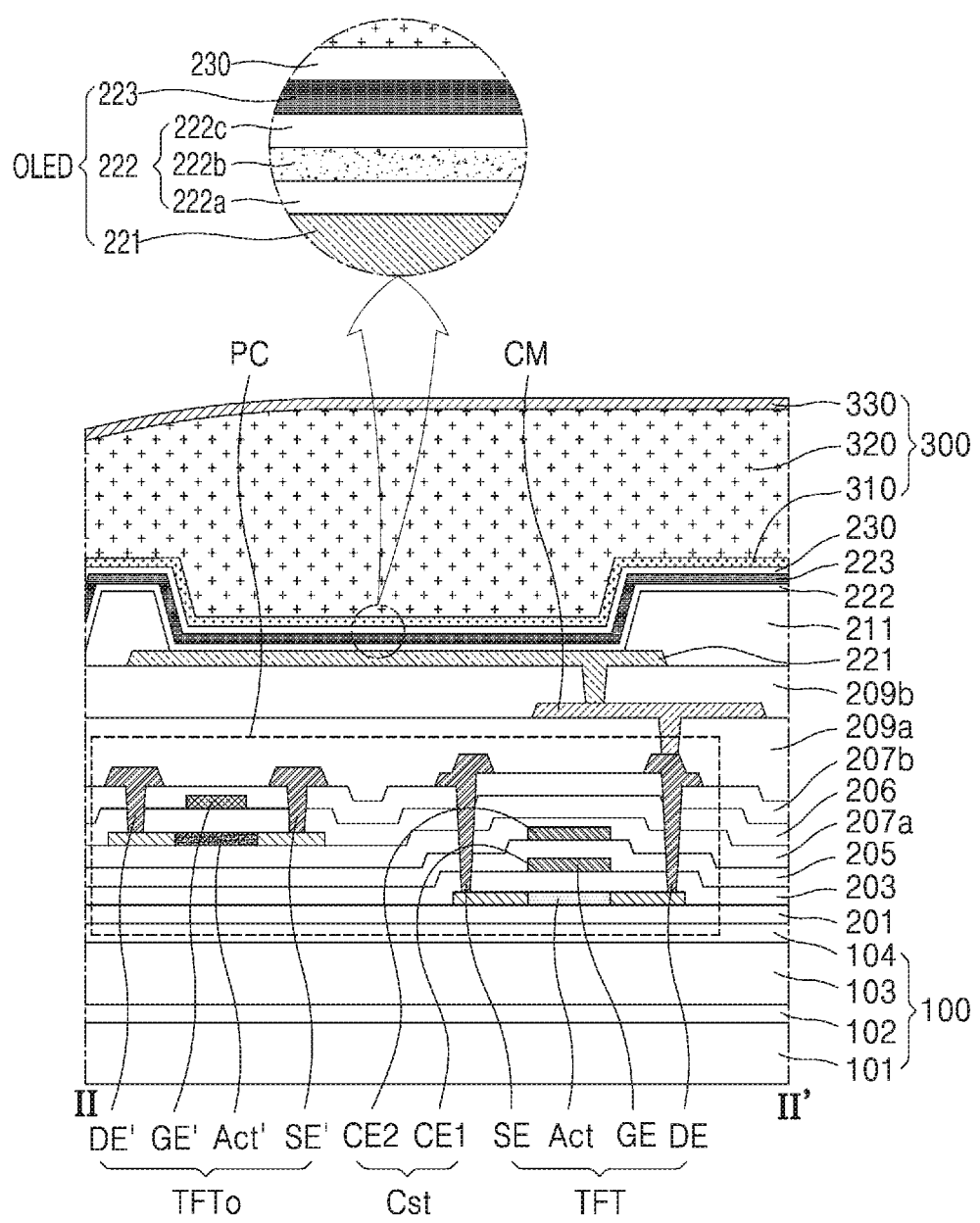
FIG. 8 is a cross-sectional view showing one pixel included in a display panel according to an embodiment.

FIG. 8 is a cross-sectional view of one pixel included in the display panel 10 according to the embodiment, taken along line II-IT of FIG. 7.

As shown in FIG. 8, the pixel circuit PC and a display element electrically connected to the pixel circuit PC may be in the display area DA. Hereinafter, a case in which the display element is an organic light-emitting diode OLED will be described as an embodiment, but one or more embodiments are not limited thereto.

The pixel circuit PC on the substrate 100 may include thin film transistors and the storage capacitor Cst, and the organic light-emitting diode OLED connected to the pixel circuit PC may be disposed on the pixel circuit PC. That the organic light-emitting diode OLED is electrically connected to the pixel circuit PC may be understood that a pixel electrode 221 of the organic light-emitting diode OLED is electrically connected to the pixel circuit PC.

The substrate 100 may include glass, metal, or a polymer resin. When the substrate 100 is flexible or bendable, the substrate 100 may include a polymer resin such as a polyethersulfone, polyacrylate, polyetherimide, polyethylene naphthalate, polyethylene terephthalate, polyphynylene sulfide, polyarylate, polyimide, polycarbonate, or cellulose acetate propionate. The substrate 100 may be variously modified, for example, the substrate 100 may have a multi-layered structure including two layers each having a polymer resin and a barrier layer including an inorganic material such as silicon oxide, silicon nitride, silicon oxynitride, etc. between the two layers.

For example, as shown in FIG. 8, the substrate 100 may include a first base layer 101, a first inorganic barrier layer 102, a second base layer 103, and a second inorganic barrier layer 104 that are sequentially stacked in the stated order. The first and second base layers 101 and 103 may each include a polymer resin. The first and second inorganic barrier layers 102 and 104 prevent permeation of impurities from the outside, and may each include an inorganic material such as silicon oxide, silicon nitride, or silicon oxynitride in a single-layered or multi-layered structure.

A buffer layer 201 may be disposed on the substrate 100. The buffer layer 201 may include an inorganic material such as silicon oxide, silicon nitride, and/or silicon oxynitride, and may have a single-layered or multi-layered structure. In addition, the buffer layer 201 may extend to the display area and the non-display area. The buffer layer 201 may improve flatness of the upper surface of the substrate 100, or may prevent or reduce permeation of impurities or moisture into an active layer from the outside of the substrate 100.

The pixel circuit PC may be disposed on the buffer layer 201. The pixel circuit PC included in each pixel in the display area DA may include a plurality of thin film transistors and the storage capacitor Cst. The number of thin film transistors included in each pixel is not restricted and may be modified variously from two to seven thin film transistors, etc. Also, each of the pixels may further include a capacitor.

In an embodiment, the pixel circuit PC may include the first thin film transistor TFT, a second thin film transistor TFTo, and the storage capacitor Cst.

The first thin film transistor TFT may include a first semiconductor layer Act including polycrystalline silicon, a first gate electrode GE, a first source electrode SE, and a first drain electrode DE. The first thin film transistor TFT shown in FIG. 8 may correspond to the driving thin film transistor described above with reference to FIG. 6. In the embodiment, a top gate-type transistor in which the first gate electrode GE is disposed over the first semiconductor layer Act with a first gate insulating layer 203 disposed therebetween is shown, but, according to another embodiment, the first thin film transistor TFT may be a bottom gate-type transistor.

The first semiconductor layer Act may include polysilicon (poly-Si). Alternatively, the first semiconductor layer Act may include amorphous silicon (Amorphous-Si), an oxide semiconductor, an organic semiconductor, etc.

The first gate electrode GE is disposed on the first semiconductor layer Act so as to at least partially overlap the first semiconductor layer Act. The first gate electrode GE may include various conductive materials including molybdenum (Mo), aluminum (Al), copper (Cu), titanium (Ti), etc., and may have various layered structures. For example, the first gate electrode GE may include a Mo layer and an Al layer, or a multi-layered structure including Mo/Al/Mo. Also, in alternative embodiments, the gate electrode may have a multi-layered structure including an ITO layer covering a metal material. This may be also applied to a second gate electrode GE' that will be described later.

In addition, in order to ensure an insulating property between the first semiconductor layer Act and the first gate electrode GE, the first gate insulating layer 203 may be disposed between the first semiconductor layer Act and the first gate electrode GE. The first gate insulating layer 203 may be an insulating layer including an inorganic material such as silicon oxide, silicon nitride, and/or silicon oxynitride. This may be also applied to a second gate insulating layer 205 and a third gate insulating layer 206 that will be described later.

The first source electrode SE and the first drain electrode DE may include various conductive materials including molybdenum (Mo), aluminum (Al), copper (Cu), titanium (Ti), etc., and may have various layered structures. For example, the first source electrode SE and the first drain electrode DE may each include a Ti layer and an Al layer, or a multi-layered structure including Ti/Al/Ti. The first source electrode SE and the first drain electrode DE may be connected to a source region and a drain region of the semiconductor layer via contact holes. Also, in alternative embodiments, the first source electrode SE and the first drain electrode DE may each have a multi-layered structure including an ITO layer covering a metal material. This may be also applied to a second source electrode SE' and a second drain electrode DE' that will be described later.

The storage capacitor Cst may include a lower electrode CE1 and an upper electrode CE2.

The lower electrode CE1 may be connected to the first gate electrode GE of the first thin film transistor TFT and the upper electrode CE2 may be connected to a driving voltage line (not shown). Here, the lower electrode CE1 may be integrally provided with the first gate electrode GE. That is, the first gate electrode GE may also function as the lower electrode CE1 of the storage capacitor Cst, as well as the control electrode of the first thin film transistor TFT.

The storage capacitor Cst may store and maintain a voltage corresponding to a difference between a voltage of the driving voltage line and a voltage of the first gate electrode GE in order to maintain the voltage applied to the first gate electrode GE.

The upper electrode CE2 overlaps the lower electrode CE1 with the second gate insulating layer 205 disposed therebetween. In this case, the second gate insulating layer 205 may function as a dielectric layer of the storage capacitor Cst. The upper electrode CE2 may include a conductive material including molybdenum (Mo), aluminum (Al), copper (Cu), titanium (Ti), etc., and may have a single-layered or multi-layered structure. As an example, the upper electrode CE2 may have a single layer including Mo or a multi-layered structure including Mo/Al/Mo. Also, in alternative embodiments, the upper electrode CE2 may have the same material as that of a second semiconductor layer Act' in the second thin film transistor TFTo and may have the same layered structure as that of the second semiconductor layer Act'.

A first interlayer insulating layer 207a may be disposed on the second gate insulating layer 205 while covering the upper electrode CE2 of the storage capacitor Cst. That is, the upper electrode CE2 may be disposed between the second gate insulating layer 205 and the first interlayer insulating layer 207a. The first interlayer insulating layer 207a may be an insulating layer including an inorganic material such as silicon oxide, silicon nitride, and/or silicon oxynitride. This may be also applied to a second interlayer insulating layer 207b that will be described later.

The second thin film transistor TFTo may include the second semiconductor layer Act' including an oxide semiconductor, the second gate electrode GE', the second source electrode SE', and the second drain electrode DE'.

The second semiconductor layer Act' may be disposed on the first interlayer insulating layer 207a. That is, the first semiconductor layer Act and the second semiconductor layer Act' may be at different layers from each other. The second semiconductor layer Act' may include a channel region, and a source region and a drain region at opposite sides of the channel region. In some embodiments, the second semiconductor layer Act' may include an oxide semiconductor. For example, the second semiconductor layer Act' may include Zn oxide-based material, e.g., Zn oxide, In—Zn oxide, Ga—In—Zn oxide, etc. Alternatively, the second semiconductor layer Act' may include an In—Ga—Zn—O (IGZO), an In—Sn—Zn—O (ITZO), or an In—Ga—Sn—Zn—O (IGTZO) semiconductor including ZnO with metal such as indium (In), gallium (Ga), and tin (Zn).

The second gate electrode GE' overlaps the channel region of the second semiconductor layer Act', and a third gate insulating layer 206 may be disposed between the second semiconductor layer Act' and the second gate electrode GE'. That is, the second gate electrode GE' may be insulated from the second semiconductor layer Act' by the third gate insulating layer 206. In addition, in the drawings, the third gate insulating layer 206 is provided on an entire surface of the substrate 100, but the third gate insulating layer 206 may be patterned according to a shape of the second gate electrode GE'.

The second gate electrode GE' may include a conductive material including molybdenum (Mo), aluminum (Al), copper (Cu), titanium (Ti), etc., and may have a single-layered or multi-layered structure.

The third gate insulating layer 206 may include an inorganic material including an oxide material or a nitride material. For example, the third gate insulating layer 206 may be an insulating layer including an inorganic material such as silicon oxide, silicon nitride, and/or silicon oxynitride. The second gate electrode GE' is disposed on the third gate insulating layer 206 and may have a single-layered or multi-layered structure including molybdenum (Mo), copper (Cu), titanium (Ti), etc.

The second interlayer insulating layer 207b may cover the second gate electrode GE' of the second thin film transistor TFTo and may be disposed on the substrate 100. The first source electrode SE and the first drain electrode DE of the first thin film transistor TFT and the second source electrode SE' and the second drain electrode DE' of the second thin film transistor TFTo may be disposed on the second interlayer insulating layer 207b. The second interlayer insulating layer 207b may be an insulating layer including an inorganic material such as silicon oxide, silicon nitride, and/or silicon oxynitride.

The second source electrode SE' and the second drain electrode DE' may be connected respectively to the source region and the drain region of the second semiconductor layer Act' via contact holes penetrating through the second interlayer insulating layer 207b. The second source electrode SE' and the second drain electrode DE' may include a conductive material including Mo, Al, Cu, Ti, etc., and may have a single-layered or multi-layered structure including the above materials.

Because the thin film transistor including the semiconductor layer including polycrystalline silicon such as the second thin film transistor TFTo has high reliability, the second thin film transistor TFTo may be adopted as the driving thin film transistor to implement a high quality display panel.

Oxide semiconductor has a high carrier mobility and a low leakage current, and thus, a voltage drop may not be large even when a driving time is increased. That is, because there is a small color change in the image due to the voltage drop even in a low frequency driving, a low frequency driving of the oxide semiconductor is possible. As described above, because the oxide semiconductor has the low leakage current, the oxide semiconductor may be employed as at least one of the other thin film transistors than the driving thin film transistor so as to prevent the leakage current and reduce power consumption.

A first planarization layer 209a and a second planarization layer 209b may be disposed on the second interlayer insulating layer 207b. Accordingly, a conductive pattern such as a wiring may be provided between the first planarization layer 209a and the second planarization layer 209b, and high integration may be implemented.

The first planarization layer 209a may cover the pixel circuit PC. The second planarization layer 209b is disposed on the first planarization layer 209a and may have a flat upper surface such that a pixel electrode 221 may be formed to be flat. The first planarization layer 209a and the second planarization layer 209b may each include an organic material or an inorganic material, and may have a single-layered or multi-layered structure. The first and second planarization layers 209a and 209b may each include a general universal polymer (benzocyclobutene (BCB), polyimide, hexamethyldisiloxane (HMDSO), polymethylmethacrylate (PMMA), or polystyrene (PS)), polymer derivatives having phenol groups, acryl-based polymer, imide-based polymer, aryl ether-based polymer, amide-based polymer, fluoride-based polymer, p-xylene-based polymer, or vinyl alcohol-based polymer. In addition, the first and second planarization layers 209a and 209b may each include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$). When the first and second planarization layers 209a and 209b are formed, a chemical mechanical polishing may be performed on an upper surfaces of the layers in order to provide flat upper surfaces after forming the layers.

The organic light-emitting diode OLED is disposed on the second planarization layer 209b. The pixel electrode 221 of the organic light-emitting diode OLED may be electrically connected to the pixel circuit PC via a connecting electrode CM disposed on the first planarization layer 209a. That is, the connecting electrode CM may be disposed between the first planarization layer 209a and the second planarization layer 209b. The connecting electrode CM may include a conductive material including molybdenum (Mo), aluminum (Al), copper (Cu), titanium (Ti), etc., and may have a single-layered or multi-layered structure. As an example, the connecting electrode CM may have a multi-layered structure including Ti/Al/Ti.

The pixel electrode 221 may be disposed on the second planarization layer 209b. The pixel electrode 221 may include a conductive oxide such as indium tin oxide (ITO), indium zinc oxide (IZO), zinc oxide (ZnO), indium oxide ($In_2O_3$), indium gallium oxide, or aluminum zinc oxide (AZO). In another embodiment, the pixel electrode 221 may include a reflective layer including argentum (Ag), magnesium (Mg), aluminum (Al), platinum (Pt), palladium (Pd), aurum (Au), nickel (Ni), neodymium (Nd), iridium (Jr), chromium (Cr), or a compound thereof. In another embodiment, the pixel electrode 221 may further include a layer including ITO, IZO, ZnO, or $In_2O_3$ on and/or under the reflective layer. In this case, the pixel electrode 221 may include a stack structure including ITO/Ag/ITO.

A pixel defining layer 211 may be formed on the pixel electrode 221. The pixel defining layer 211 includes an opening exposing an upper surface of the pixel electrode 221, but covers edges of the pixel electrode 221. Accordingly, the pixel defining layer 211 may define a light-emitting region of a pixel. The pixel defining layer 211 may include an organic insulating material. For example, the pixel defining layer 211 may include an organic insulating material such as polyimide, polyamide, acrylic resin, benzocyclobutene, hexamethyldisiloxane (HMDSO), and phenolic resin, and may be formed by spin coating.

An intermediate layer 222 includes an emission layer 222b. The intermediate layer 222 may include a first functional layer 222a under the emission layer 222b and/or a second functional layer 222c on the emission layer 222b. The emission layer 222b may include a polymer or low-molecular weight organic material emitting predetermined color light.

The first functional layer 222a may have a single-layered or multi-layered structure. For example, when the first functional layer 222a includes a polymer material, the first functional layer 222a includes a hole transport layer (HTL) having a single-layered structure, and may include poly-(3, 4)-ethylene-dihydroxy thiophene (PEDOT) or polyaniline (PANI). When the first functional layer 222a includes a low-molecular weight material, the first functional layer 222a may include a hole injection layer (HIL) and/or an HTL.

The second functional layer 222c is optional. For example, when the first functional layer 222a and the emission layer 222b include a polymer material, the second functional layer 222c may be formed. The second functional layer 222c may have a single-layered or multi-layered structure. The second functional layer 222c may include an electron transport layer (ETL) and/or an electron injection layer (EIL).

The emission layer 222b of the intermediate layer 222 may be disposed in every pixel in the display area DA. The emission layer 222b may contact an upper surface of the pixel electrode 221 which is exposed through the opening in the pixel defining layer 211. The first and second functional layers 222a and 222c of the intermediate layer 222 may extend to the middle area MA, as well as the display area DA.

The opposite electrode 223 may include a conductive material having a low work function. For example, the opposite electrode 223 may include a (semi-)transparent layer including argentum (Ag), magnesium (Mg), aluminum (Al), platinum (Pt), palladium (Pd), aurum (Au), nickel (Ni), neodymium (Nd), iridium (Ir), chromium (Cr), lithium (Li), calcium (Ca), or an alloy thereof. Alternatively, the opposite electrode 223 may further include a layer including ITO, IZO, ZnO, or $In_2O_3$ on the (semi-)transparent layer including the above material. The opposite electrode 223 may be provided on the middle area MA, as well as the display area DA. The intermediate layer 222 and the opposite electrode 223 may be formed by a thermal evaporation method.

A capping layer 230 may be disposed on the opposite electrode 223. The capping layer 230 protects the opposite electrode 223 and may include LiF, an inorganic material, and/or an organic material. In an alternative embodiment, the capping layer 230 may be omitted.

Because the organic light-emitting diode OLED may be easily damaged due to moisture or oxygen from the outside, the organic light-emitting diode OLED may be covered by the thin film encapsulation layer 300. The thin film encapsulation layer 300 may include at least one organic encapsulation layer and at least one inorganic encapsulation layer. For example, the thin film encapsulation layer 300 may include a first inorganic encapsulation layer 310, a second inorganic encapsulation layer 330, and an organic encapsulation layer 320 disposed between the first and second inorganic encapsulation layers 310 and 330. The thin film encapsulation layer 300 covers the display area DA and may extend to the outside of the display area DA and the middle area MA.

The first inorganic encapsulation layer 310 covers the opposite electrode 223, and may include silicon oxide, silicon nitride, and/or silicon oxynitride. The first inorganic encapsulation layer 310 is formed along a structure thereunder, and thus, the first inorganic encapsulation layer 310 has an uneven upper surface.

The organic encapsulation layer 320 covers the first inorganic encapsulation layer 310, and unlike the first inorganic encapsulation layer 310, the organic encapsulation layer 320 may have a flat upper surface. In detail, the organic encapsulation layer 320 may planarize the upper surface of a portion corresponding to the display area DA. The organic encapsulation layer 320 may include one or more materials selected from the group consisting of polyethylene terephthalate, polyethylene naphthalate, polycarbonate, polyimide, polyethylene sulfonate, polyoxymethylene, polyarylate, and hexamethyl disiloxane.

The second inorganic encapsulation layer 330 covers the organic encapsulation layer 320, and may include silicon oxide, silicon nitride, and/or silicon oxynitride. The second inorganic encapsulation layer 330 contacts the first inorganic encapsulation layer 310 at an edge thereof on an outer portion of the display area DA, and the organic encapsulation layer 320 may not be exposed to outside.

As described above, because the thin film encapsulation layer 300 includes the first inorganic encapsulation layer 310, the organic encapsulation layer 320, and the second inorganic encapsulation layer 330, even when the thin film encapsulation layer 300 cracks, the cracks may be disconnected between the first inorganic encapsulation layer 310 and the organic encapsulation layer 320 or between the organic encapsulation layer 320 and the second inorganic encapsulation layer 330 through the multi-layered structure. As such, generation of a permeation path through which the external moisture or oxygen passes to the display area DA may be prevented or reduced.

Figure 9:
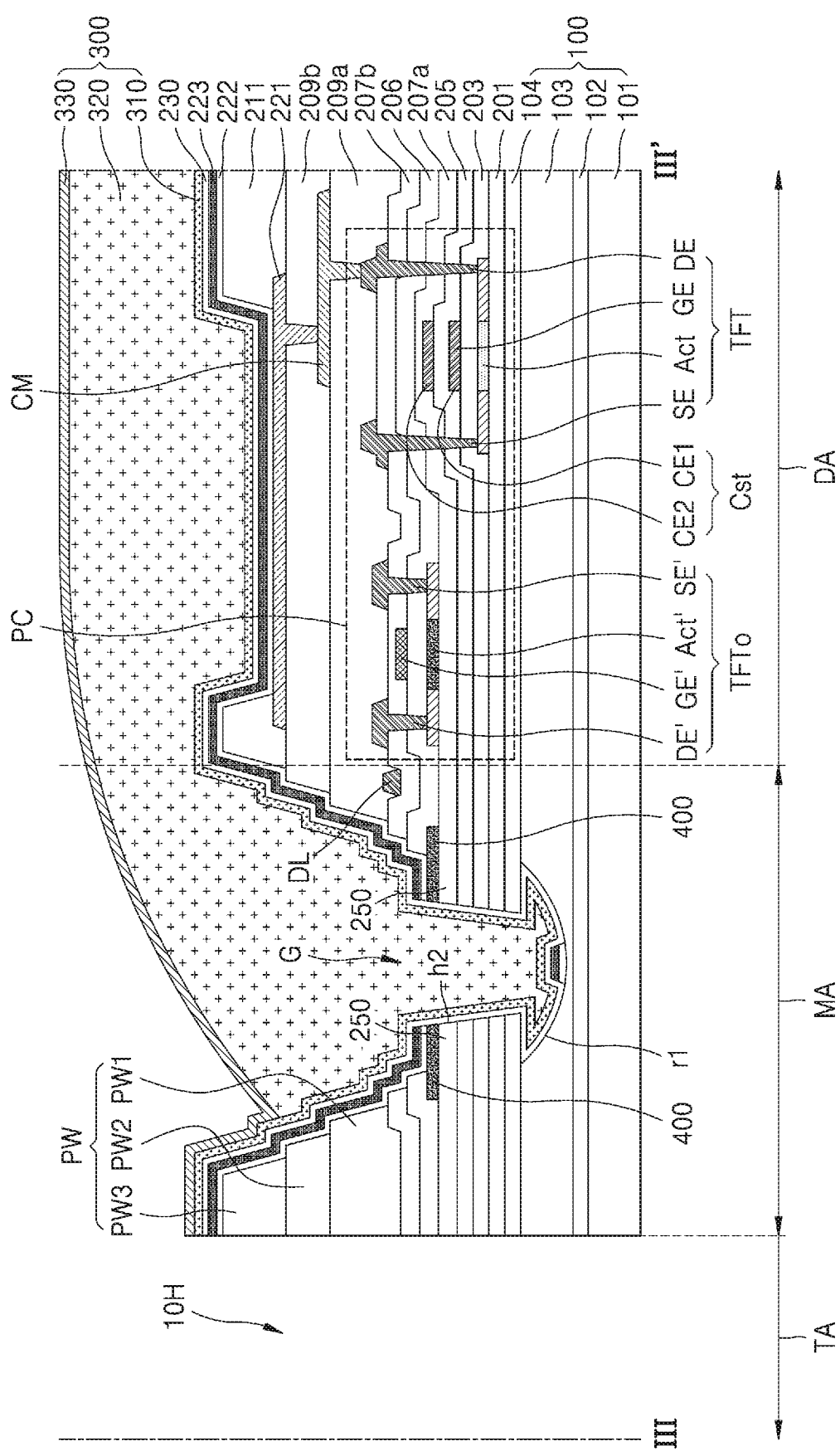
FIG. 9 is a cross-sectional view showing a portion of a display panel according to an embodiment.
Figure 10:
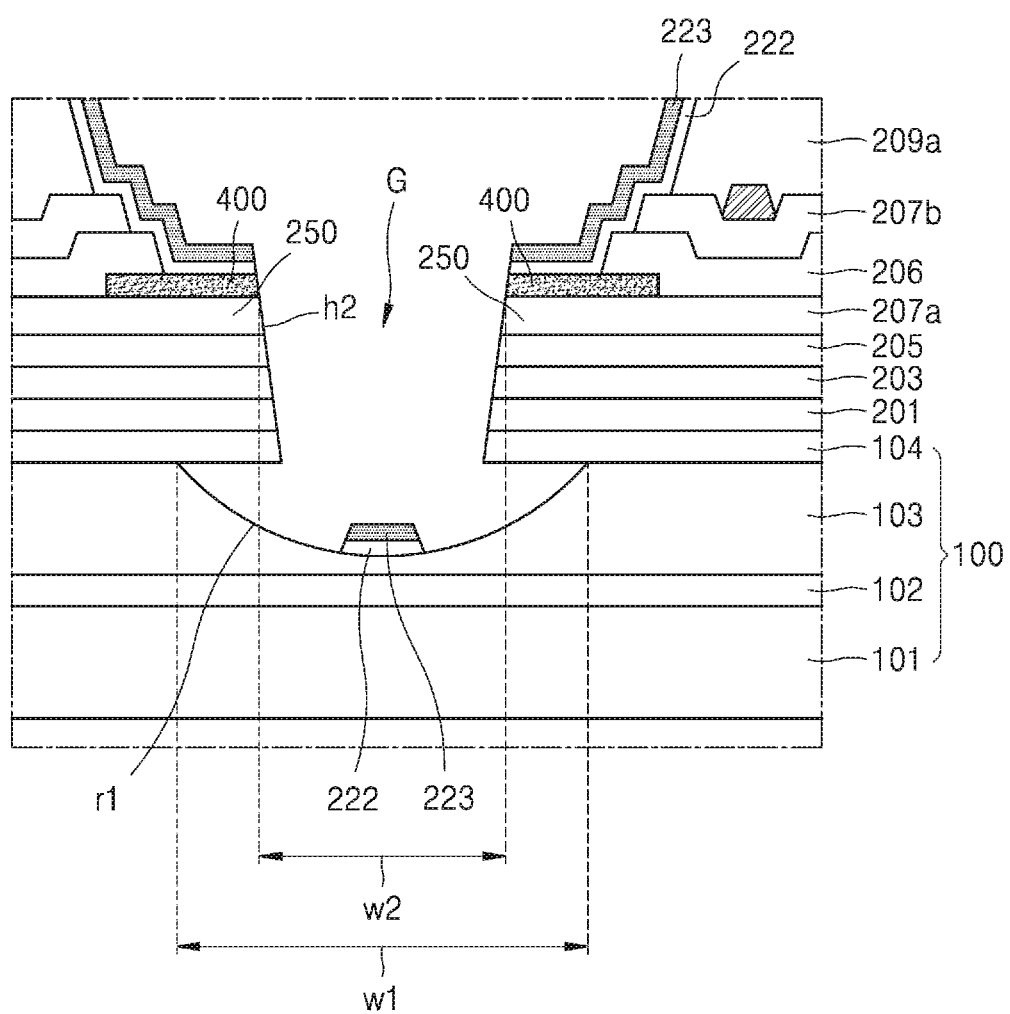
FIG. 10 is a cross-sectional view partially showing a groove according to an embodiment.
Figure 11:
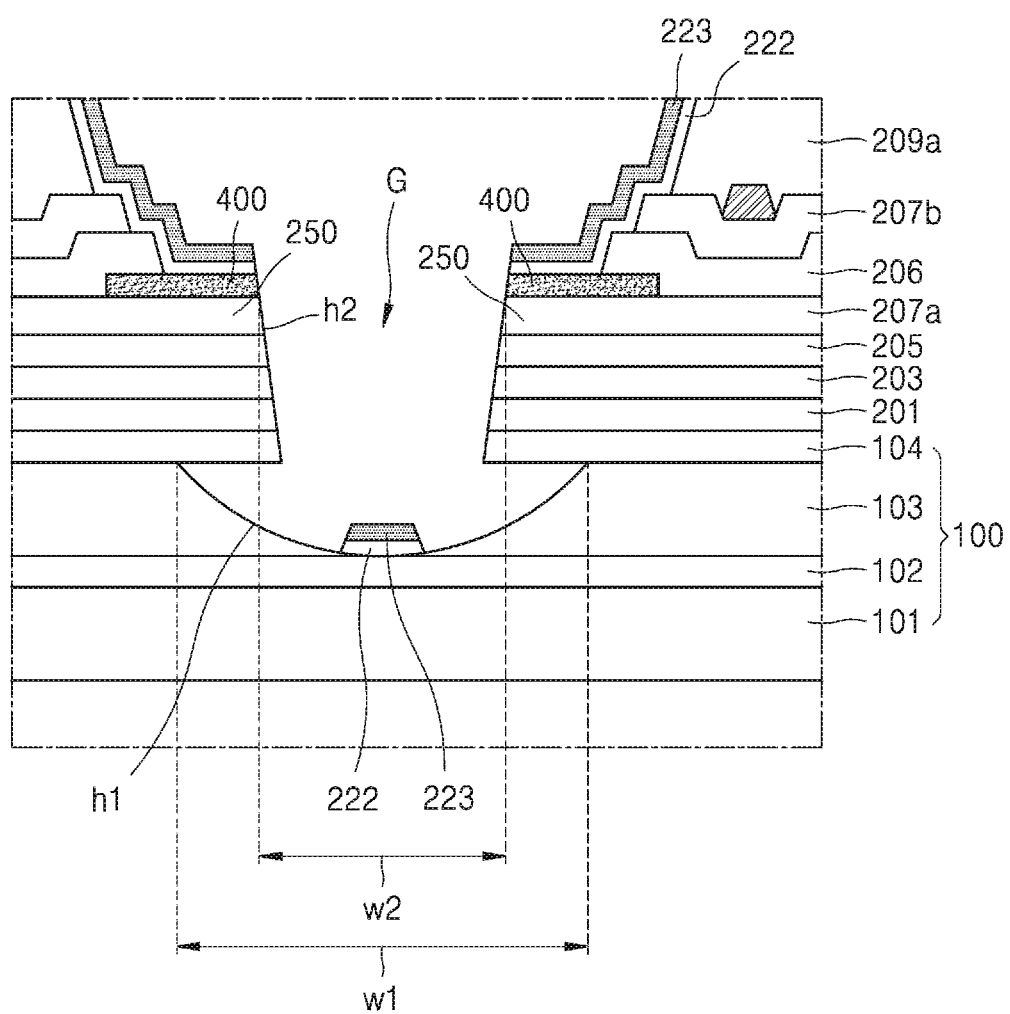
FIG. 11 is a cross-sectional view partially showing a groove according to another embodiment.

FIG. 9 is a cross-sectional view showing a portion of a display panel according to one embodiment, FIG. 10 is a cross-sectional view showing a portion of a groove according to an embodiment, and FIG. 11 is a cross-sectional view showing a portion of a groove according to an embodiment.

Hereinafter, like reference numerals denote like elements, and descriptions about the elements described above will be omitted.

As shown in FIG. 9, one or more grooves G may be disposed in the middle area MA. For convenience of description, FIG. 9 shows that the display panel includes one groove G, but the display panel may include two or more grooves G.

When the display panel includes a plurality of grooves G, barrier walls PW may be disposed between adjacent the grooves G. The barrier wall PW may include a plurality of barrier wall layers that are sequentially stacked. In an embodiment, the barrier wall PW may include a first barrier wall layer PW1, a second barrier wall layer PW2, and a third barrier wall layer PW3, as shown in FIG. 9. The first barrier wall layer PW1 may include the same material as that of the first planarization layer 209a, the second barrier wall layer PW2 may include the same material as that of the second planarization layer 209b, and the third barrier wall layer PW3 may include the same material as that of the pixel defining layer 211.

In addition, as described above with reference to FIG. 7, like the groove G which is located in the middle area MA while surrounding the first through hole 10H as a concentric circle, the barrier wall PW may also be disposed in the middle area MA while surrounding the first through hole 10H in the form of a concentric circle in a plan view.

Referring to FIGS. 10 and 11, a first hole h1 or a first recess r1 constituting the groove G may have an undercut structure or an eave structure. In detail, the groove G may include the first hole h1 or the first recess r1 formed in the base layer of the substrate 100, a second hole h2 overlapping the first hole h1 or the first recess r1 in a plan view, a pair of tips 250 facing each other with the second hole h2 interposed therebetween, and a pair of pattern layers 400 disposed on the pair of tips 250.

The groove G may be obtained by an etching process, e.g., an isotropic etching process, and may have the first hole h1 or the first recess r1 according to an etched degree.

In an embodiment, as shown in FIG. 10, the groove G may include the first hole h1 in the second base layer 103 of the substrate and the second hole h2 overlapping the first hole h1.

In another embodiment, as shown in FIG. 11, the groove G may include the first recess r1 formed in the second base layer 103 of the substrate 100 and the second hole h2 overlapping the first recess r1. Here, a depth of the first recess r1 may be less than that of the second base layer 103 of the substrate 100.

The second hole h2 is formed in at least one of the inorganic insulating layers on the substrate 100. In detail, the second hole h2 is formed in the inorganic insulating layer(s) between the pattern layers 400 that will be described later and the first hole h1 or the first recess r1. The second hole h2 overlaps the first hole h1 or the first recess r1 in a plan view.

The pair of tips 250 are portions of inorganic insulating layers disposed on undercut portions formed in the second base layer 103 in a plan view and may be obtained when the at least one inorganic insulating layer in which the second hole h2 is formed extends toward the center of the second hole h2 from an edge of an upper surface of the layer in which the first hole h1 or the first recess r1 is formed. That is, the pair of tips 250 define the second hole h2 and may be the inorganic insulating layer(s) protruded toward the center of the second hole h2.

Accordingly, a width w2 of the second hole h2 is less than a width w1 of the first hole h1 or the first recess r1. Here, the width w1 of the first hole h1 or the first recess r1 denotes, in a plan view, a distance in a horizontal direction between edges of the upper surface of the layer (e.g., 103) in which the first hole h1 or the first recess r1 is formed in a plan view. Also, the width w2 of the second hole h2 denotes, in a plan view, a distance in the horizontal direction between edges of an upper surface of an uppermost layer from among the inorganic insulating layer(s) in which the second hole h2 is formed.

The pair of pattern layers 400 may overlap the pair of tips 250, on the upper surface of the uppermost layer from among one or more inorganic insulating layers in which the second hole h2 is formed in a plan view. The pair of pattern layers 400 functions as a mask when the groove G structure is manufactured, thereby simplifying manufacturing processes. The pair of pattern layers 400 functioning as a mask will be described later with reference to FIGS. 15 to 20.

The groove G having the above structure may be manufactured before forming the intermediate layer 222. From among layers on the substrate 100, a layer including an organic material may be a path through which moisture moves. For example, as shown in FIGS. 8 and 9, when the display panel includes the first through hole 10H, the moisture may move along a direction in parallel with the upper surface of the substrate 100 (hereinafter, referred to as a lateral direction), but according to the embodiment, the organic material layer, e.g., the first functional layer 222a and/or the second functional layer 222c, may be disconnected along the groove G due to the undercut formed in the second base layer 103. The first functional layer 222a and/or the second functional layer 222c may be manufactured by a thermal evaporation method, the first functional layer 222a and/or the second functional layer 222c may be disconnected due to the structure of the tips 250 when depositing the first functional layer 222a and/or the second functional layer 222c.

Similarly, the opposite electrode 223 and/or the LiF layer in the capping layer 230 may be obtained by a thermal evaporation method and may be disconnected or isolated due to the structure of the tips 250. In an embodiment, FIGS. 9 to 14 illustrate a structure in which the first functional layer 222a, the second functional layer 222c, and the opposite electrode 223 are separated due to the tips 250. Some parts of the first functional layer 222a, the second functional layer 222c, and the opposite electrode 223 may be in the bottom surface of the groove G.

As described above, the groove G disconnects or isolates the intermediate layer 222 and the opposite electrode 223, and thus, may prevent or reduce permeation of moisture and impurities along the organic material layer and propagation of cracks along the inorganic material layer in the cutting process for forming the first through hole 10H.

The thin film encapsulation layer 300 may also be disposed in the middle area MA. In detail, the thin film encapsulation layer 300 may extend from the display area DA to the middle area MA, and may successively cover an internal surface of the second hole h2, an internal surface of the first hole h1, and a bottom surface of the first hole h1.

The first inorganic encapsulation layer 310 may have a relatively excellent step coverage, as compared with the first functional layer 222a, the second functional layer 222c, the opposite electrode 223, and/or the capping layer 230. The first inorganic encapsulation layer 310 may be continuous formed as shown in FIG. 8. For example, the first inorganic encapsulation layer 310 may continuously and entirely cover an inner surface of the groove G.

The first inorganic encapsulation layer 310 may be obtained by a chemical vapor deposition method.

The organic encapsulation layer 320 may cover the groove G that is disposed closest to the display area DA among the grooves G. The groove G closest to the display area DA may be at least partially filled with the organic encapsulation layer 320.

Because the second inorganic encapsulation layer 330 has a relatively excellent step coverage similarly to the first inorganic encapsulation layer 310, the second inorganic encapsulation layer 330 may continuously cover a part of the grooves G, for example, an internal surface of the groove G between the barrier wall PW and the first through hole 10H.

Hereinafter, referring to FIGS. 9, 12, 13, and 14, embodiments according to layered structures of the pattern layers 400 and the upper electrode CE2 will be described hereinbelow. Like reference numerals denote like elements, and descriptions about the elements described above will be omitted.

FIGS. 9, 12, 13, and 14 are cross-sectional views partially showing the display panels according to one or more embodiments.

The pattern layer 400 may be one of a layer forming the thin film transistor TFT or the organic light-emitting diode OLED. The pattern layer 400 may be a layer having a good etching selectivity with the inorganic insulating layer(s) in which the second hole h2 is formed. The pattern layer 400 may have the same material as that of the first semiconductor layer Act in the first thin film transistor TFT or the second semiconductor layer Act' in the second thin film transistor TFTo. That is, the pattern layer 400 may include polycrystalline silicon that is included in the first semiconductor layer or an oxide semiconductor that is included in the second semiconductor layer Act'. Also, the pattern layer 400 may have the same layered structure as that of the first semiconductor layer Act or the second semiconductor layer Act'. As such, there is no need to additionally perform a separate process for forming the pattern layer 400, and the pattern layer 400 may be formed by using the same material as that of the first semiconductor layer Act or the second semiconductor layer Act' during the process of forming the first semiconductor layer Act or the second semiconductor layer Act'. Thus, processes may be efficiently performed and simplified.

Figure 12:
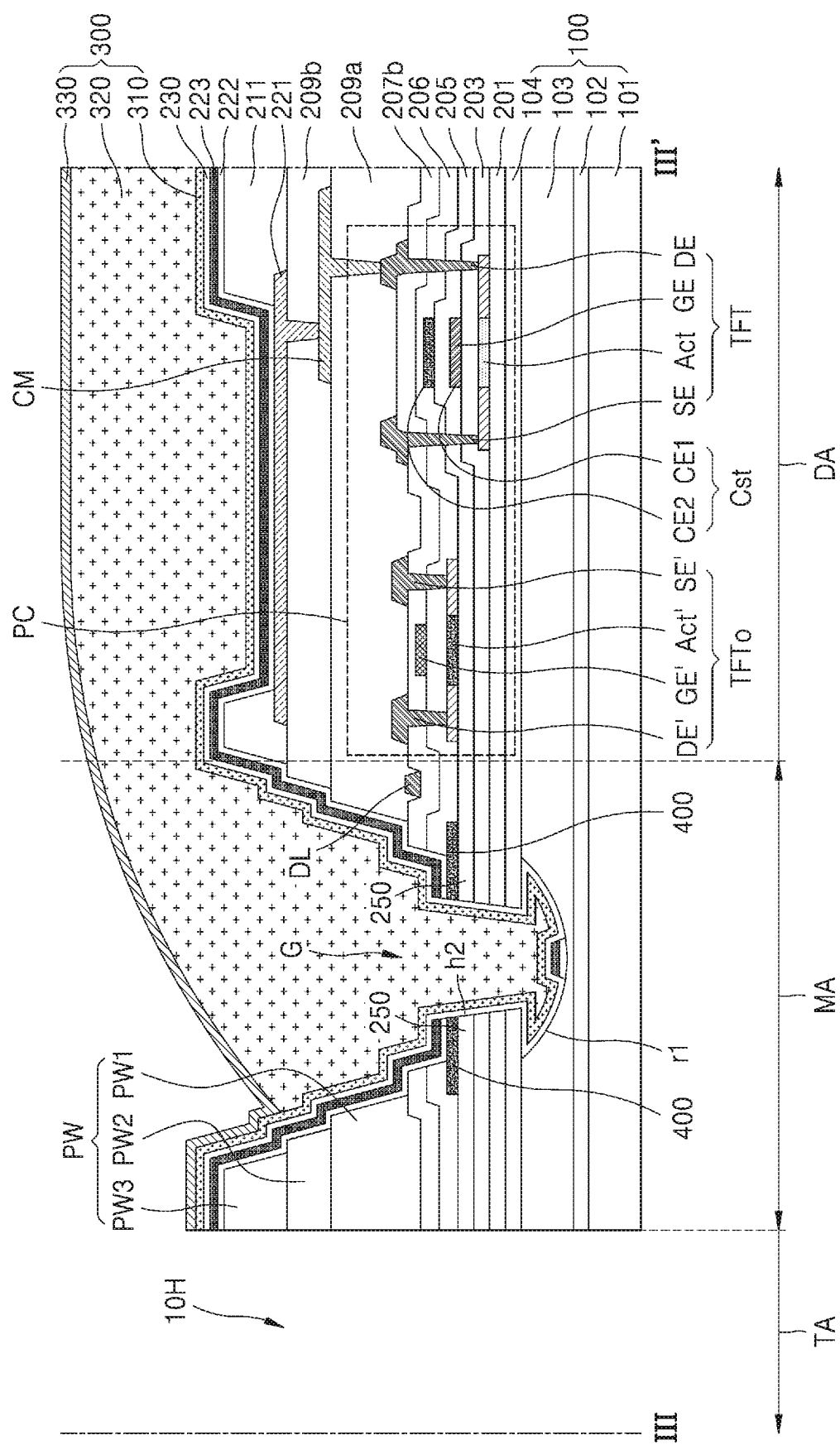
FIG. 12 is a cross-sectional view showing a portion of a display panel according to another embodiment.

In an embodiment, as shown in FIGS. 9 and 12, when the pattern layer 400 includes the same material as that of the second semiconductor layer Act', at least one inorganic insulating layer in which the second hole h2 is formed may include inorganic insulating layers between the first semiconductor layer Act and the second semiconductor layer Act'. In detail, at least one inorganic insulating layer in which the second hole h2 is formed may include the first gate insulating layer 203 and the second gate insulating layer 205 that are disposed between the first semiconductor layer Act and the second semiconductor layer Act'. In addition, when the display panel further includes the storage capacitor Cst including the lower electrode CE1 and the upper electrode CE2, wherein the lower electrode CE1 is integrally provided with the first gate electrode GE of the first thin film transistor TFT and the upper electrode CE2 overlaps the lower electrode CE1, the at least one inorganic insulating layer in which the second hole h2 is formed may include the first gate insulating layer 203, the second gate insulating layer 205, and the first interlayer insulating layer 207*a* disposed between the first semiconductor layer Act and the second semiconductor layer Act'. Moreover, when the first hole h1 or the first recess r1 is in the second base layer 103 of the substrate 100, the at least one inorganic insulating layer in which the second hole h2 is formed may further include the buffer layer 201 and the second inorganic barrier layer 104 of the substrate 100.

Figure 13:
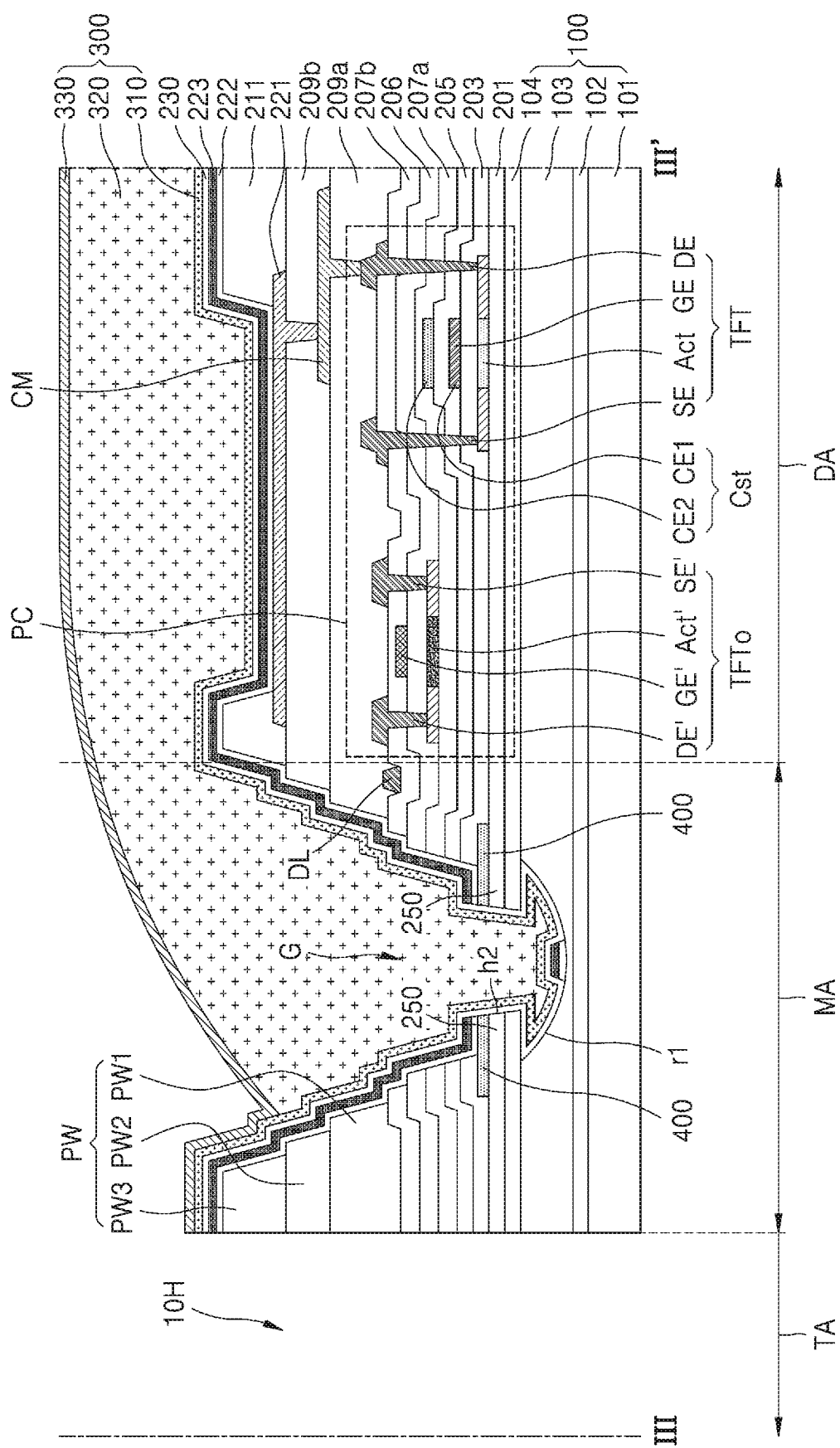
FIG. 13 is a cross-sectional view showing a portion of a display panel according to another embodiment.
Figure 14:
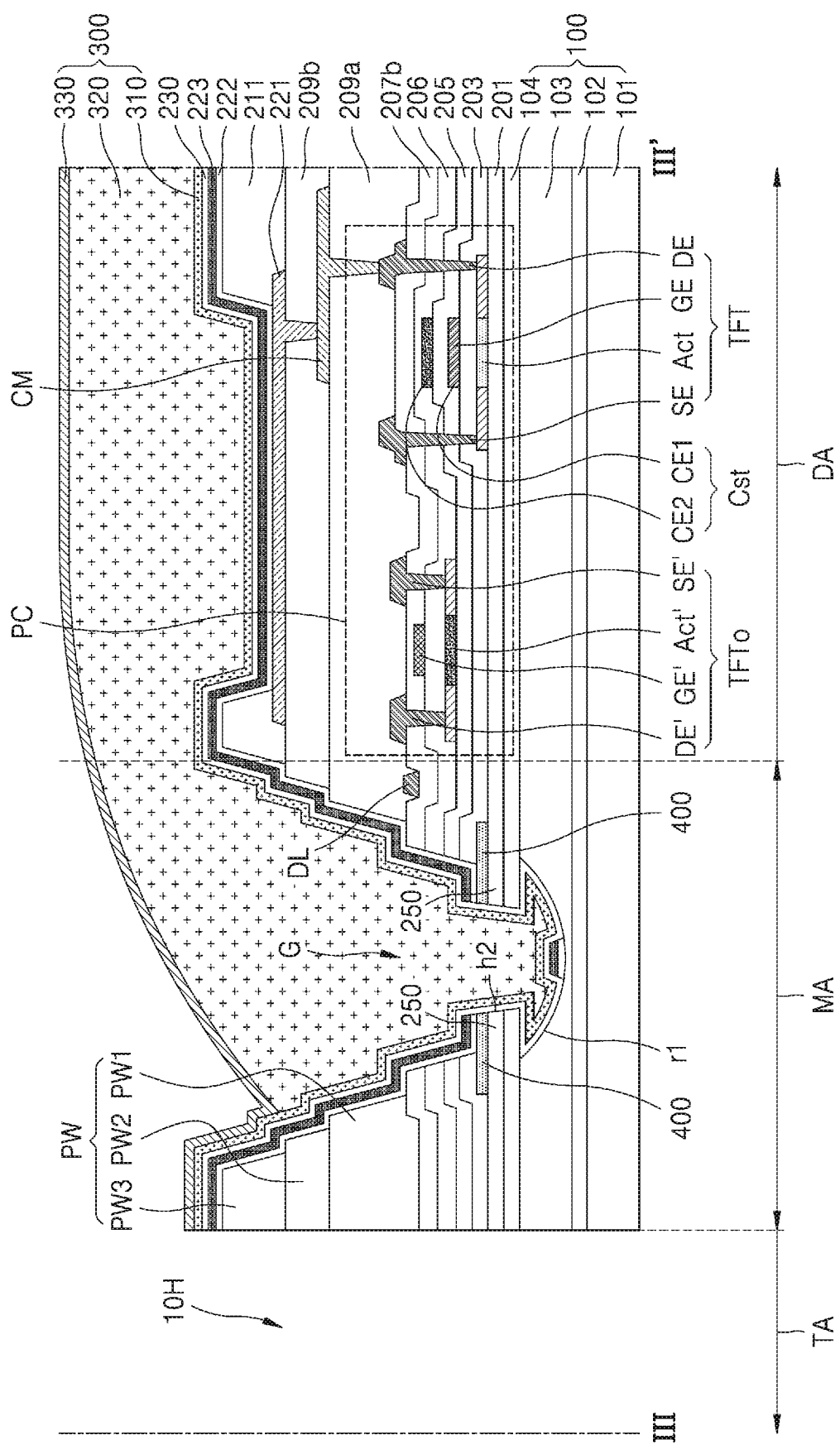
FIG. 14 is a cross-sectional view showing a portion of a display panel according to another embodiment.

In another embodiment, when the pattern layer 400 includes the same material as that of the first semiconductor layer Act as shown in FIGS. 13 and 14, the at least one inorganic insulating layer in which the second hole h2 is formed may include a layer that is in contact with a lower surface of the first semiconductor layer Act. In detail, when the first semiconductor layer Act is on the buffer layer 201 and the first hole h1 or the first recess r1 is in the second base layer 103 of the substrate 100, the at least one inorganic insulating layer in which the second hole h2 is formed may include the buffer layer 201 and the second inorganic barrier layer 104 of the substrate 100.

In addition, the upper electrode CE2 of the storage capacitor Cst may have a similar material to that of the gate electrode GE or GE', or the same material as that of the second semiconductor layer Act'.

In an embodiment, as shown in FIGS. 9 and 13, the upper electrode CE2 may include a conductive material including molybdenum (Mo), aluminum (Al), copper (Cu), titanium (Ti), etc., and may have a single-layered or multi-layered structure including the above materials.

For example, the upper electrode CE2 may have a single layer including Mo or a multi-layered structure including Mo/Al/Mo.

In another embodiment, as shown in FIGS. 12 and 14, the upper electrode CE may include the same material as that of the second semiconductor layer Act', that is, the oxide semiconductor. In this case, the upper electrode CE2 may be formed by using the same material as that of the second semiconductor layer Act' in the manufacturing process of the second semiconductor layer Act' without additionally performing a separate process for forming the upper electrode CE2, and thus, processes may be effectively performed and simplified. In addition, because the upper electrode CE2 has the same layered structure as that of the second semiconductor layer Act', the first interlayer insulating layer 207*a* covering the upper electrode CE2 is not necessary. That is, the third gate insulating layer 206 covering the second semiconductor layer Act' may also cover the upper electrode CE2, as well as the second semiconductor layer Act'.

FIGS. 15 to 20 are cross-sectional views illustrating a method of manufacturing a groove according to an embodiment.

FIGS. 15 to 20 illustrate the method of manufacturing the groove in an embodiment, in which the pattern layer 400 includes the same material as that of the second semiconductor layer Act', but descriptions about the function of the pattern layer 400 may be also applied to the other embodiments. Also, FIGS. 15 to 20 show a portion where the groove G is formed, but omitted elements may be also simultaneously formed during the process for forming the same layer.

The buffer layer 201 is arranged on the substrate 100, and at least one inorganic insulating layer is arranged on the buffer layer 201. The at least one inorganic insulating layer may include the first gate insulating layer 203, the second gate insulating layer 205, and the first interlayer insulating layer 207*a*. In addition, although not shown in the drawings, elements, such as the first thin film transistor TFT located under the first interlayer insulating layer 207*a*, are arranged in the display area on the substrate 100. Here, the first thin film transistor TFT includes the first semiconductor layer Act including polycrystalline silicon.

Figure 15:
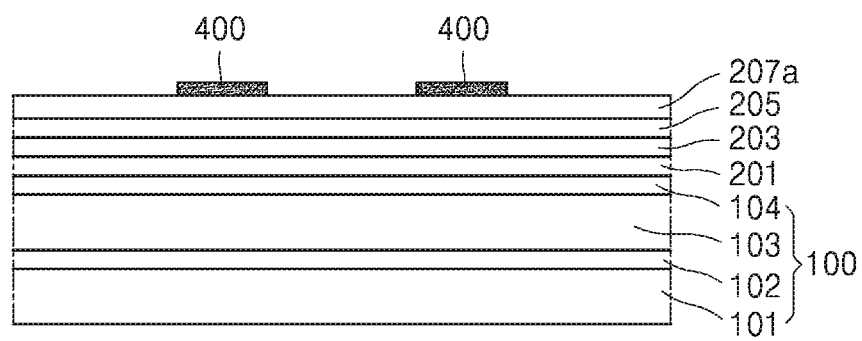
FIGS. 15, 16, 17, 18, 19 and 20 are cross-sectional views illustrating a method of manufacturing a groove, according to an embodiment.

In addition, as shown in FIG. 15, the second semiconductor layer Act' of the second thin film transistor TFTo and the pair of pattern layers 400 are arranged on the uppermost layer of the at least one inorganic insulating layer. The second semiconductor layer Act' and the pair of pattern layers 400 may include oxide semiconductor. Also, the pair of pattern layers 400 may be formed as concentric circles in the middle area MA surrounding the transmission area TA in which the first through hole 10H is to be formed on the substrate 100.

In addition, in an alternative embodiment, the upper electrode CE2 of the storage capacitor Cst may be formed in the process of forming the second semiconductor layer Act'. In this case, the upper electrode CE2 includes the same material as that of the second semiconductor layer Act', and has the same layered structure as that of the second semiconductor layer Act'.

Figure 16:
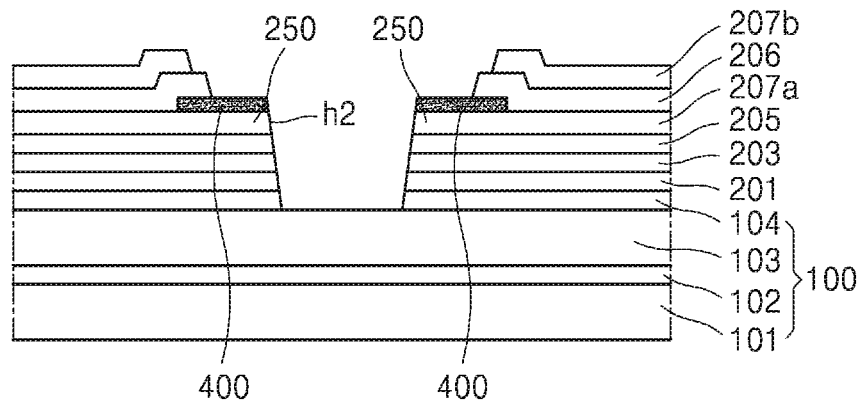

In addition, as shown in FIG. 16, the second hole h2 is formed in the at least one inorganic insulating layer using the pair of pattern layers 400 as an etching mask. That is, the second hole h2 may be obtained by removing the inorganic insulating layer(s) in a region between the pair of pattern layers 400. Each of the inorganic insulating layer(s) may be simultaneously patterned when a source contact hoe and a drains contact hole for the second semiconductor layer Act' are formed. Here, in the inorganic insulating layer(s), portions overlapping the pattern layers 400 are masked by the pattern layers 400 and not removed to form the tips 250. That is, the tips 250 are masked by the pair of pattern layers 400 not to be removed during the etching and then extend toward the center of the second hole h2, when the second hole h2 is formed. Also, the second hole h2 and the tips 250 may be formed as concentric circles in the middle area MA surrounding the transmission area TA in which the first through hole 10H is to be formed on the substrate 100 like the pattern layers 400.

An anisotropic dry-etching process using photoresist as a mask may be applied to the above patterning process, but one or more embodiments are not limited thereto, that is, an arbitrary patterning process may be used. This may be also applied to another patterning process included in the method of manufacturing the display apparatus according to one or more embodiments.

In the embodiment, the pattern layers 400 that are obtained simultaneously with the forming of the second semiconductor layer Act' are used as an etching mask, and thus, a process of forming an additional mask pattern which is required in the processes of forming the groove G may be omitted and the manufacturing processes may be simplified.

Figure 17:
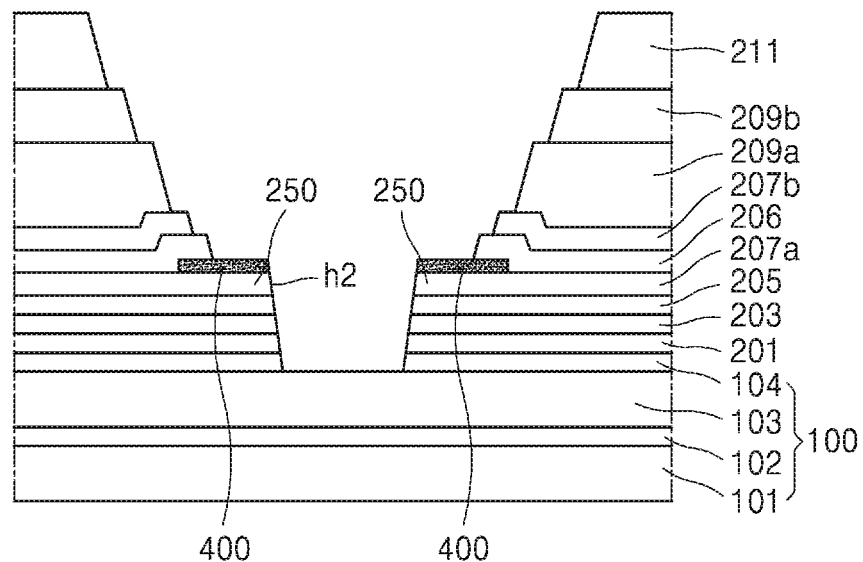

Next, as shown in FIG. 17, the first and second planarization layers 209*a* and 209*b* and the pixel defining layer 211 having an opening exposing the second hole h2 are arranged on the second interlayer insulating layer 207*b*.

Figure 18:
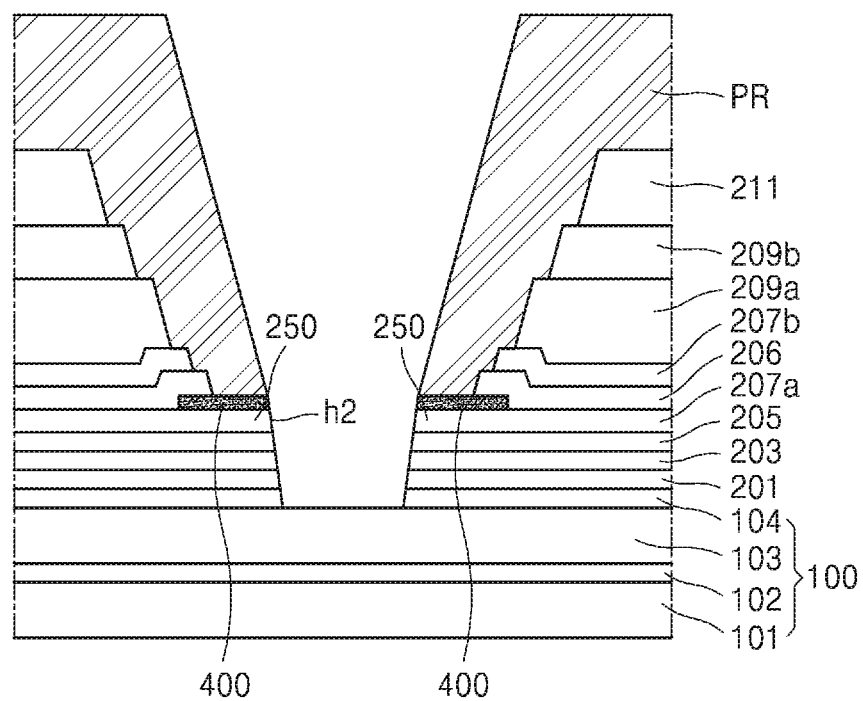

Then, as shown in FIG. 18, a photoresist PR is formed on the pixel defining layer 211 to expose the second hole h2. In detail, the photoresist PR is applied onto the entire surface of the substrate 100 and the photoresist corresponding to the second hole h2 is removed.

The photoresist PR as above may include aromatic bisazide, methacrylic acid ester, cinnamic acid ester, etc. as a negative-type photoresist, and may include polymethyl methacrylate, naphthquinone diazide, polybutene-1-sulfone, etc. as a positive-type photoresist, but is not limited to thereto.

Figure 19:
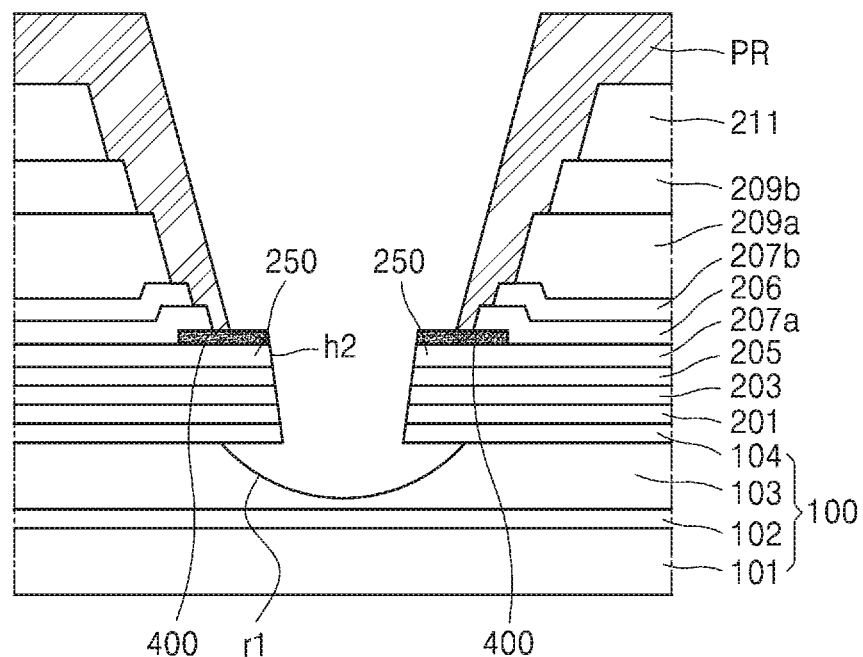

Next, as shown in FIG. 19, the etching process is performed to form the first recess r1 in the base layer of the substrate 100. The first recess r1 is formed in an area corresponding to the second hole h2. FIG. 19 shows a case in which the first recess r1 is formed in the second base layer 103, but the first hole h1(See FIG. 11) may be formed throughout the second base layer 103. Here, an isotropic dry-etching process, for example, plasma etching, a wet-etching process, etc. using the photoresist as an etching mask may be applied to the patterning process.

Figure 20:
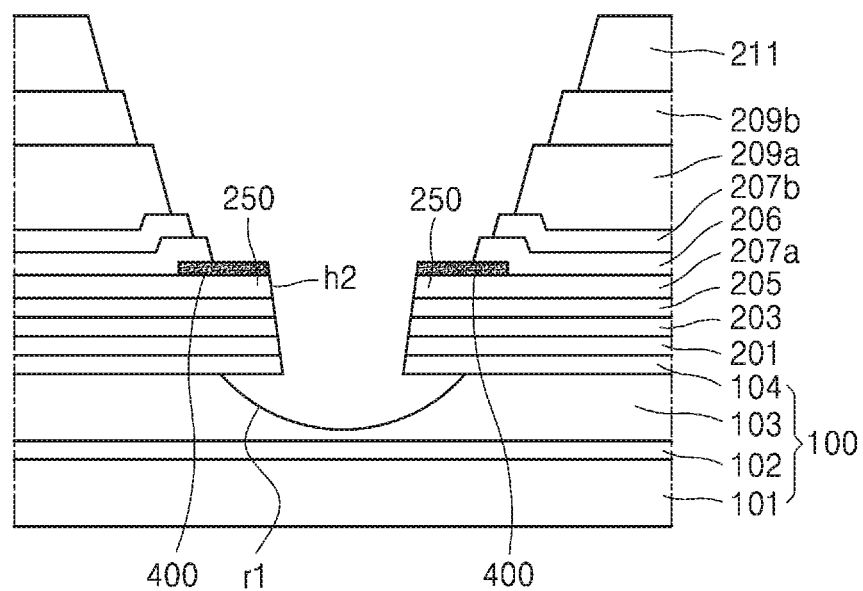

Next, as shown in FIG. 20, the photoresist material PR is removed. A strip process or an ashing process may be used to remove the photoresist material PR, but one or more embodiments are not limited thereto.

Next, a display element having a pixel electrode, an opposite electrode, and an intermediate layer including the emission layer and provided between the pixel electrode and the opposite electrode is arranged on the display area DA of the substrate 100.

Also, a thin film encapsulation layer covering the display element and including a first inorganic encapsulation layer, an organic encapsulation layer, and a second inorganic encapsulation layer may be provided to continuously cover the internal surface of the second hole h2, the internal surface of the first hole h1 or the first recess r1, and the bottom surface of the first hole h1 or the first recess r1.

According to one or more embodiments, defects formed during the manufacturing processes or defects formed while using the display apparatus having the transmission area may be reduced, and the manufacturing processes of the display apparatus may be simplified.

However, the scope of the disclosure is not limited to the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate comprising a transmission area having a first through hole, a display area surrounding the transmission area, and a middle area disposed between the transmission area and the display area;
a pixel circuit disposed on the display area, the pixel circuit comprising a first thin film transistor including a first semiconductor layer including polycrystalline silicon and a second thin film transistor including a second semiconductor layer including an oxide semiconductor;
a display element including a pixel electrode electrically connected to the pixel circuit, an opposite electrode disposed on the pixel electrode, and an intermediate layer disposed between the pixel electrode and the opposite electrode and including an emission layer; and
a groove disposed in the middle area while surrounding the first through hole,
wherein the groove comprises:
a first hole or a first recess disposed in a base layer of the substrate,
a second hole disposed in at least one inorganic insulating layer on the substrate and overlapping the first hole or the first recess in a plan view,
a pair of tips obtained by extending the at least one inorganic insulating layer toward a center of the second hole; and
a pair of pattern layers overlapping the pair of tips and including a material that is same as a material included in the first semiconductor layer or the second semiconductor layer.

2. The display apparatus of claim 1, wherein the first semiconductor layer and the second semiconductor layer are disposed on different layers from each other.

3. The display apparatus of claim 2, wherein the pair of pattern layers include a material that is the same as a material in the second semiconductor layer and the at least one inorganic insulating layer includes a first gate insulating layer and a second gate insulating layer disposed between the first semiconductor layer and the second semiconductor layer.

4. The display apparatus of claim 2, wherein the pair of pattern layers include a material that is the same as a material in the first semiconductor layer and the at least one inorganic insulating layer includes a layer that is in contact with a lower surface of the first semiconductor layer.

5. The display apparatus of claim 1, wherein the opposite electrode is disconnected by the pair of tips.

6. The display apparatus of claim 1, wherein the intermediate layer is disconnected by the pair of tips.

7. The display apparatus of claim 6, wherein the intermediate layer further comprises a first functional layer disposed between the pixel electrode and the emission layer and a second functional layer disposed between the emission layer and the opposite electrode, the first functional layer comprises at least one of a hole transport layer and a hole injection layer, and the second functional layer comprises at least one of an electron transport layer and an electron injection layer.

8. The display apparatus of claim 1, further comprising a thin film encapsulation layer covering the display element and including a first inorganic encapsulation layer, an organic encapsulation layer, and a second inorganic encapsulation layer.

9. The display apparatus of claim 8, wherein the thin film encapsulation layer continuously covers an internal surface of the second hole, an internal surface of the first hole or the first recess, and a bottom surface of the first hole or the first recess.

10. The display apparatus of claim 1, wherein the pixel circuit further comprises a storage capacitor, and
wherein the storage capacitor includes a lower electrode that is integrally provided with a first gate electrode of the first thin film transistor and an upper electrode overlapping the lower electrode.

11. The display apparatus of claim 10, wherein the upper electrode includes a material that is the same as a material included in the second semiconductor layer.

12. The display apparatus of claim 10, wherein the upper electrode has a layered structure that is the same as a layered structure of the second semiconductor layer.

* * * * *